United States Patent
Kuroda et al.

(10) Patent No.: US 10,473,700 B2
(45) Date of Patent: Nov. 12, 2019

(54) VOLTAGE STABILITY MONITORING DEVICE AND METHOD

(71) Applicant: Hitachi, Ltd., Chiyoda-ku, Tokyo (JP)

(72) Inventors: Eisuke Kuroda, Tokyo (JP); Yasuo Sato, Tokyo (JP); Osamu Tomobe, Tokyo (JP); Jun Yamazaki, Tokyo (JP); Masahiro Yatsu, Tokyo (JP); Kouichi Hara, Tokyo (JP); Haruki Miyoshi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 464 days.

(21) Appl. No.: 15/306,226

(22) PCT Filed: Apr. 6, 2015

(86) PCT No.: PCT/JP2015/060690
§ 371 (c)(1),
(2) Date: Oct. 24, 2016

(87) PCT Pub. No.: WO2015/163121
PCT Pub. Date: Oct. 29, 2015

(65) Prior Publication Data
US 2017/0045558 A1    Feb. 16, 2017

(30) Foreign Application Priority Data
Apr. 25, 2014   (JP) ................ 2014-090829

(51) Int. Cl.
*G01R 19/25* (2006.01)
*G01R 19/00* (2006.01)
(Continued)

(52) U.S. Cl.
CPC ..... *G01R 19/2513* (2013.01); *G01R 19/0084* (2013.01); *H02J 3/00* (2013.01); *H02J 3/24* (2013.01); *H02J 13/00* (2013.01)

(58) Field of Classification Search
CPC . G01R 19/0084; G01R 19/2513; H02J 13/00; H02J 3/00; H02J 3/24
(Continued)

(56) References Cited

U.S. PATENT DOCUMENTS

| 7,236,898 B2 * | 6/2007 | Kim ........................ | H02J 3/00 702/64 |
| 7,996,116 B2 * | 8/2011 | Wiszniewski ............ | H02J 3/24 307/31 |

(Continued)

FOREIGN PATENT DOCUMENTS

| JP | 9-46935 A | 2/1997 |
| JP | 2001-25168 A | 1/2001 |

(Continued)

OTHER PUBLICATIONS

International Search Report (PCT/ISA/210) issued in PCT Application No. PCT/JP2015/060690 dated Jun. 2, 2015 with English translation (4 pages).

(Continued)

*Primary Examiner* — John H Le
(74) *Attorney, Agent, or Firm* — Crowell & Moring LLP

(57) ABSTRACT

A voltage stability monitoring device, which monitors voltage stability of a power system, produces a plurality of assumed change scenarios indicating a scenario of a change that is assumed based on at least one of a system configuration of the power system and a change of a tide state, calculates the voltage stability using the assumed change scenario, calculates a voltage stability margin indicating margin degree of the voltage stability, based on the voltage stability selects an assumed change scenario with high severity of the voltage stability for each assumed change scenario, based on the voltage stability margin calculates which buses in the power system are vulnerable buses that decrease voltage stability, based on the assumed change scenario which is selected, and changes a monitoring target of the voltage stability, based on information of the vulnerable bus.

15 Claims, 25 Drawing Sheets

(51) Int. Cl.
*H02J 3/00* (2006.01)
*H02J 3/24* (2006.01)
*H02J 13/00* (2006.01)

(58) Field of Classification Search
USPC ............... 702/64, 65; 700/295, 298; 307/31
See application file for complete search history.

(56) References Cited

U.S. PATENT DOCUMENTS 9,876,352 B2 * 1/2018 Biswas ................... H02J 3/00
2005/0256922 A1 11/2005 Kim et al.
2013/0154614 A1 6/2013 Gadiraju et al.

FOREIGN PATENT DOCUMENTS

JP 2005-287128 A 10/2005
JP 2011-115024 A 6/2011

OTHER PUBLICATIONS

Japanese-language Written Opinion (PCT/ISA/237) issued in PCT Application No. PCT/JP2015/060690 dated Jun. 2, 2015 (3 pages).
Suzuki et al., "Voltage Stability Online Monitoring System", Institute of Electrical Engineers of Theory B, vol. 111, No. 3, 1991, pp. 247-251.
Indian-language Examination Report issued in counterpart Indian Application No. 201617035648 dated Feb. 12, 2019 with English translation (five (5) pages).

* cited by examiner

[Fig. 1]
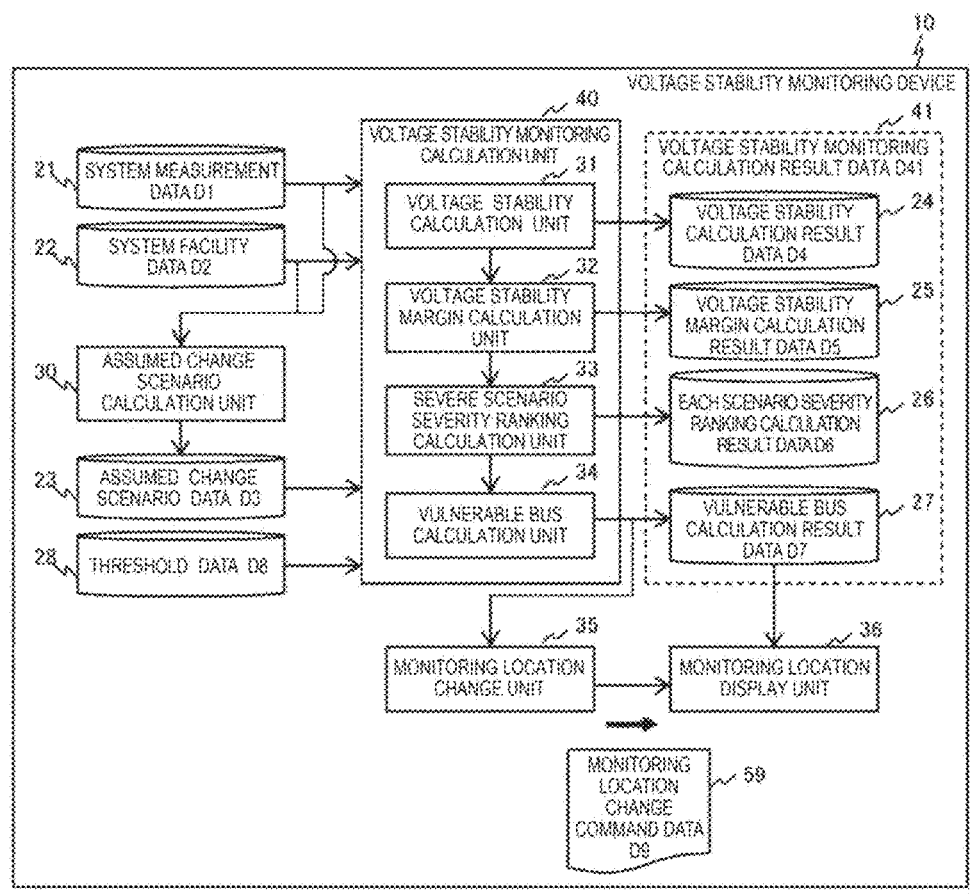

[Fig. 2]
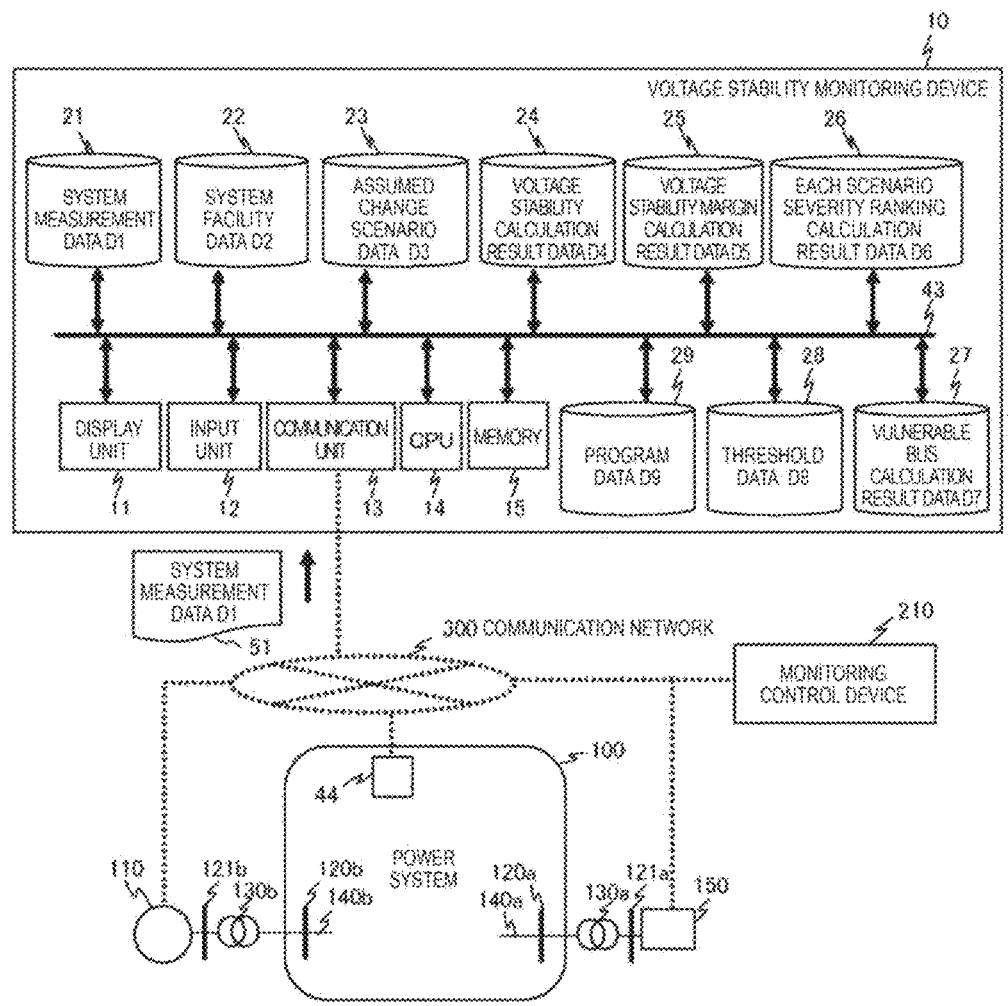

[Fig. 3]
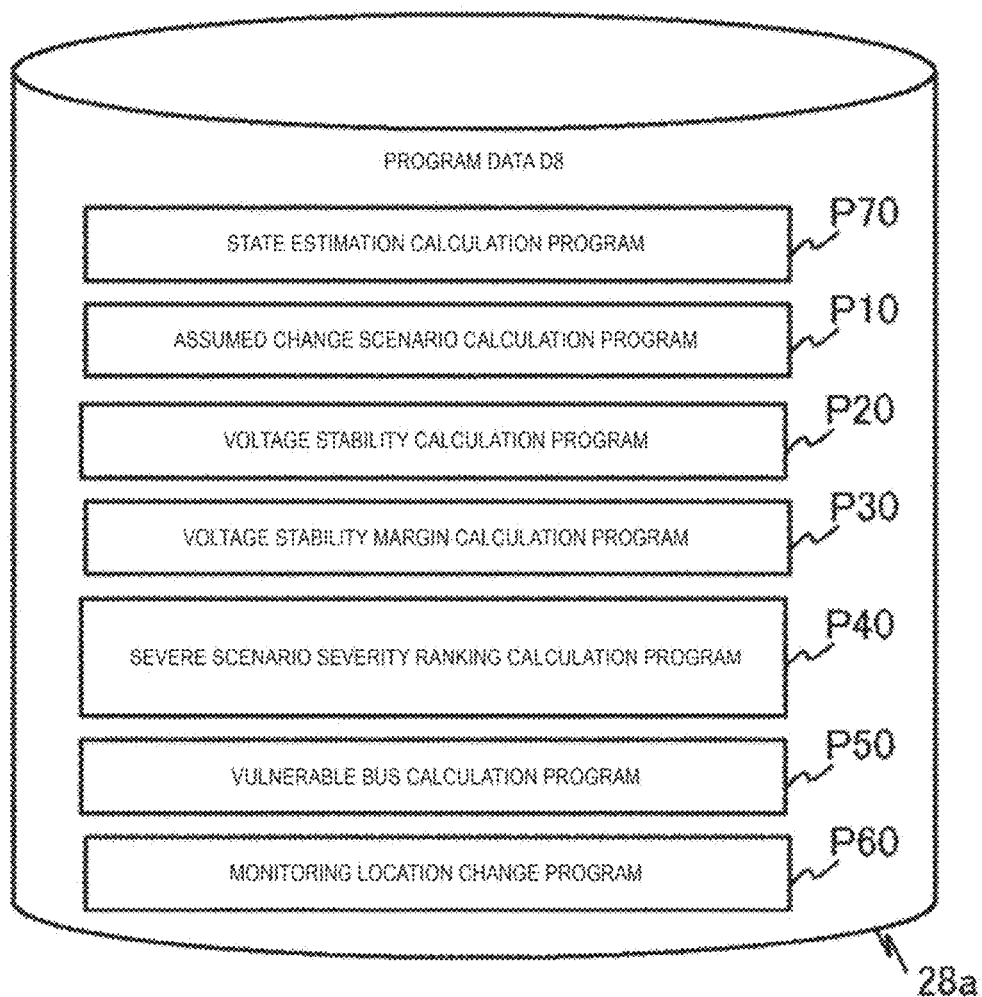

[Fig. 4]

| ASSUMED CHANGE SCENARIO No | ASSUMED FAILURE LOCATION | ASSUMED FAILURE ASPECT | ASSUMED RENEWABLE ENERGY CHANGE AMOUNT | ... |
|---|---|---|---|---|
| 1 | — | — | — | ... |
| 2 | — | — | $\Delta P_{MAX}$ | ... |
| 3 | — | — | $\Delta P_{MIN}$ | ... |
| 4 | 140c | 3Φ4LG | $\Delta P_{MAX}$ | ... |
| 5 | 140c | 3Φ4LG | — | ... |
| 6 | 140c | 3Φ4LG | $\Delta P_{MIN}$ | ... |
| 7 | 140c | 3Φ6LG | $\Delta P_{MAX}$ | ... |
| 8 | 140c | 3Φ6LG | — | ... |
| 9 | 140c | 3Φ6LG | $\Delta P_{MIN}$ | ... |
| : | : | : | : | ... |
| : | 120d | 3ΦG | $\Delta P_{MAX}$ | ... |
| : | 120d | 3ΦG | — | ... |
| : | 120d | 3ΦG | $\Delta P_{MIN}$ | ... |
| : | : | : | : | ... |

[Fig. 5]

| SEVERITY THRESHOLD [%] | VULNERABLE BUS THRESHOLD | |
|---|---|---|
| | $\Delta V0[p.u.]$ | $\Delta V/\Delta P$ |
| XX.XXX | YY.YYY | ZZ.ZZZ |

| SEVERITY THRESHOLD [%] | VULNERABLE BUS THRESHOLD |
|---|---|
| | $\Delta Q$ |
| XX.XXX | YY.YYY |

[Fig. 6]
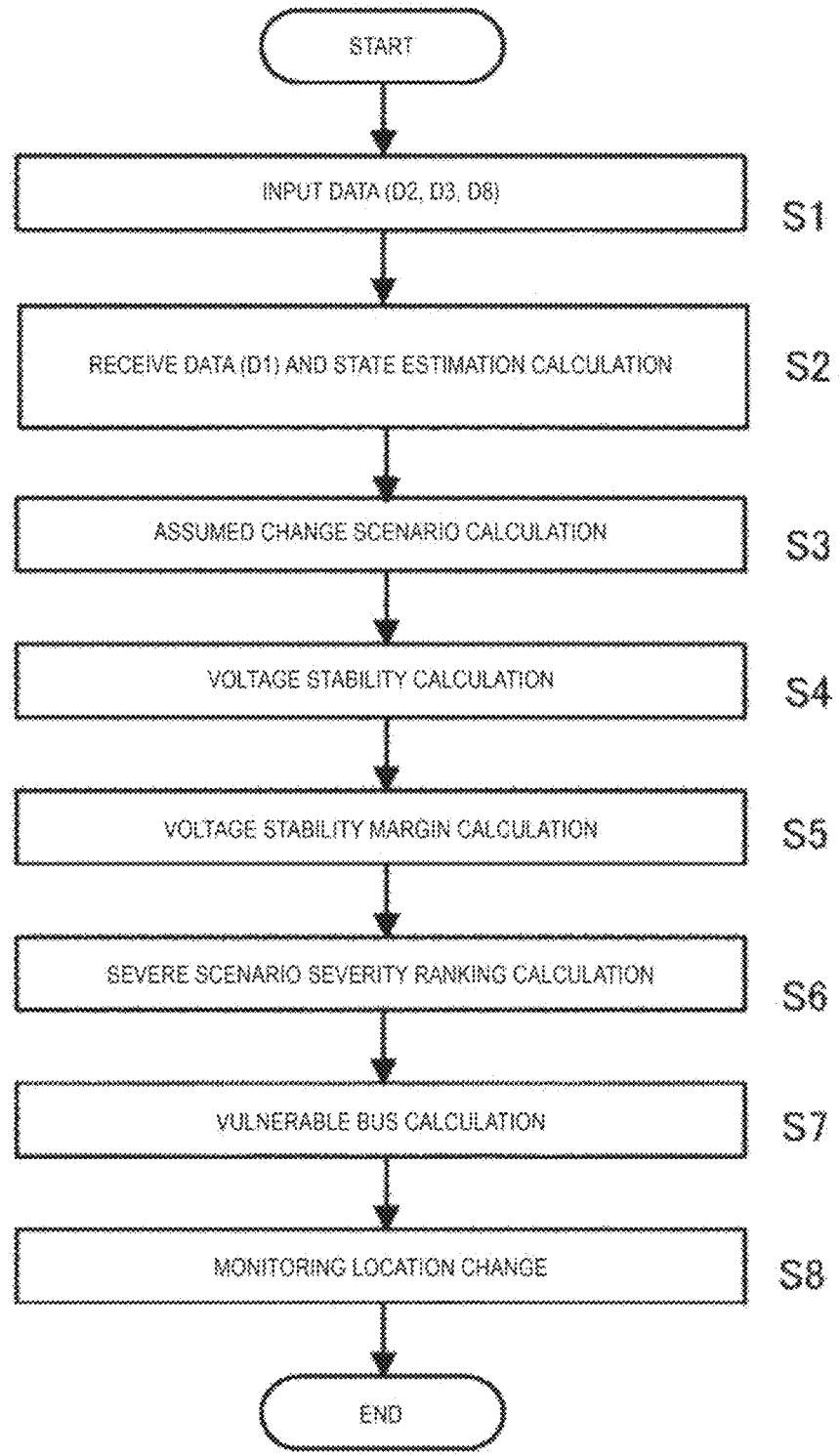

[Fig. 7]
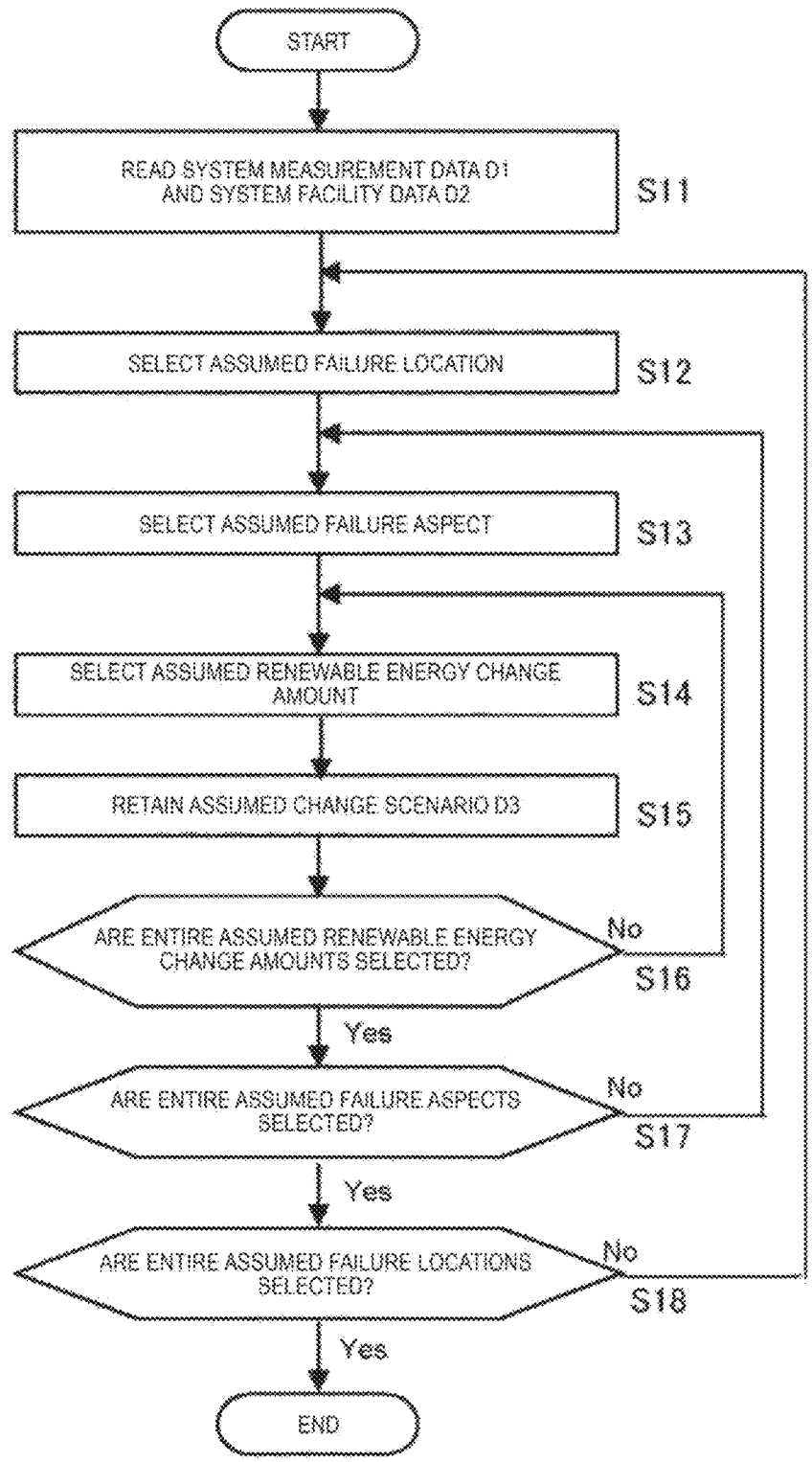

[Fig. 8]
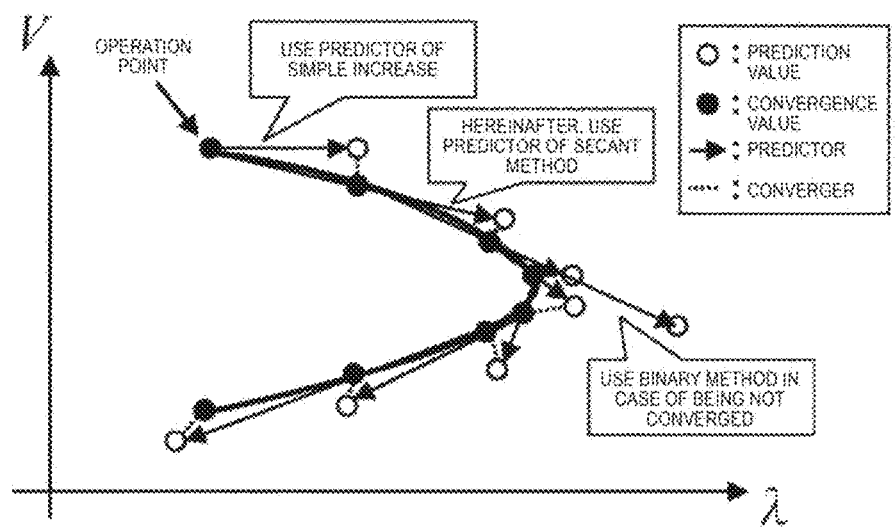

[Fig. 9]
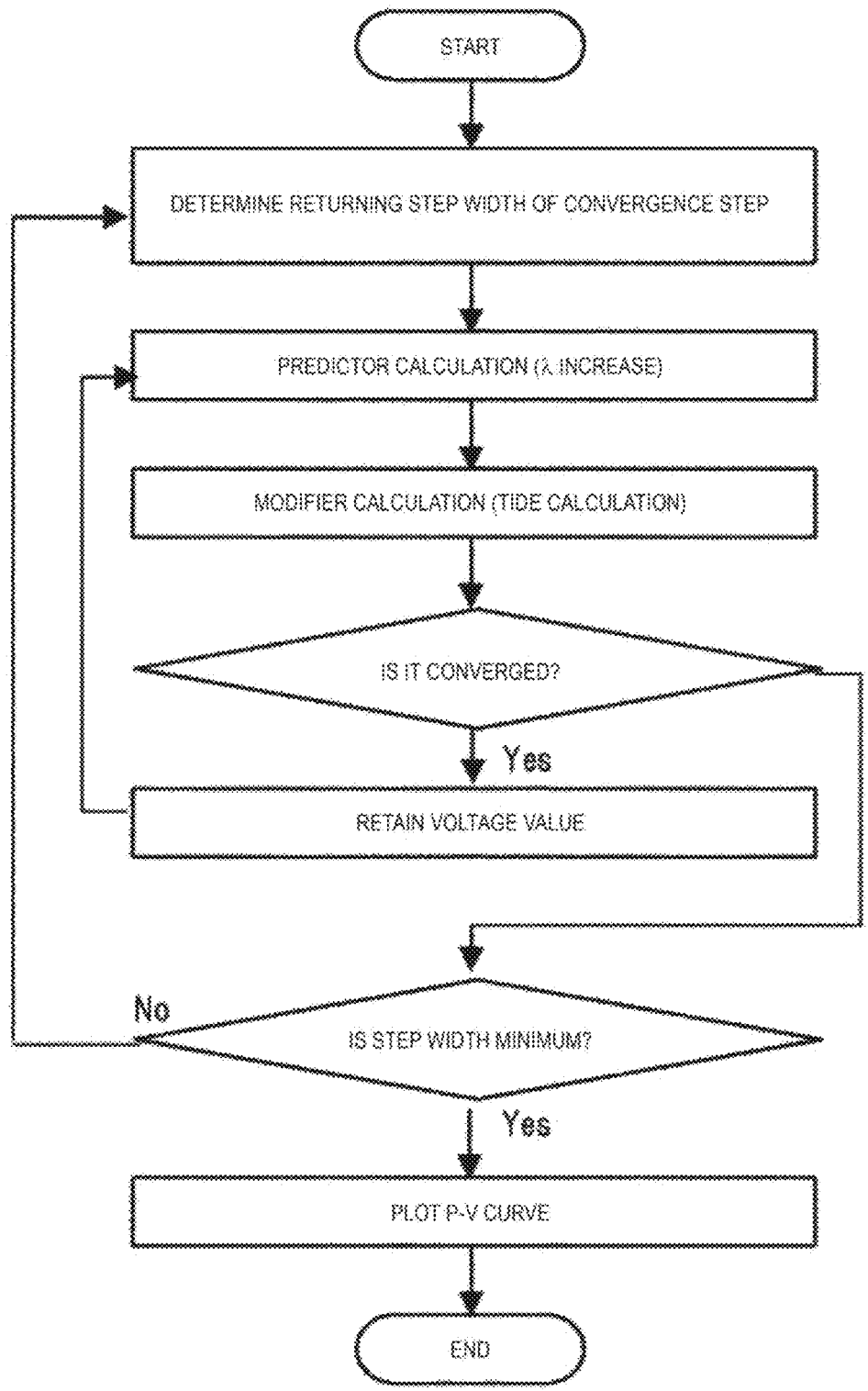

[Fig. 10]
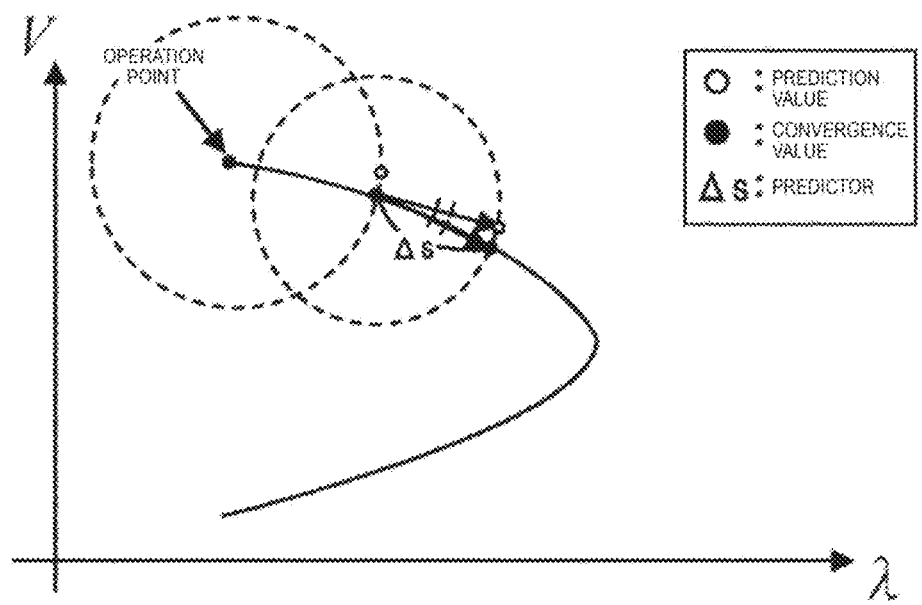

[Fig. 11]
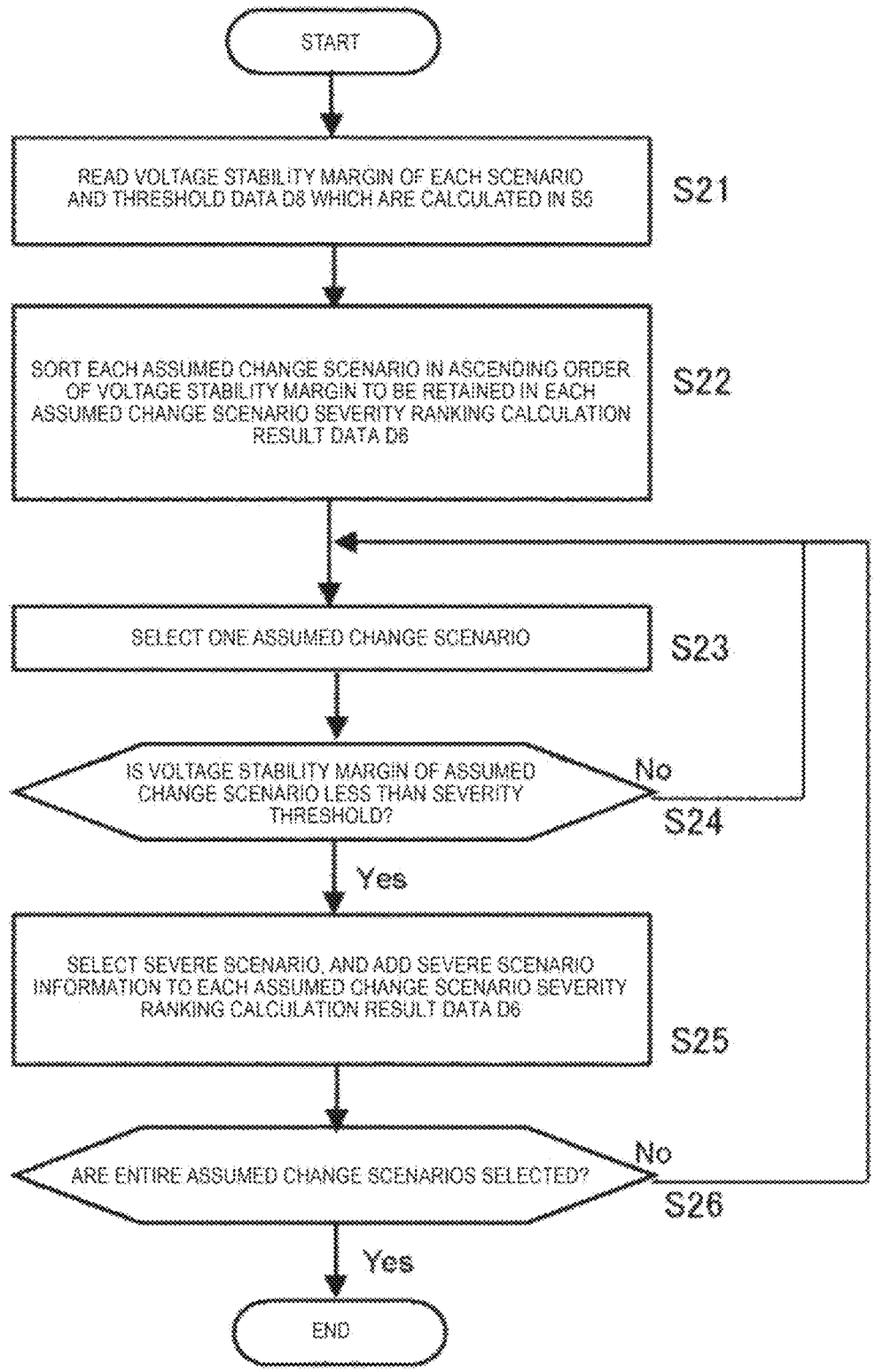

[Fig. 12]
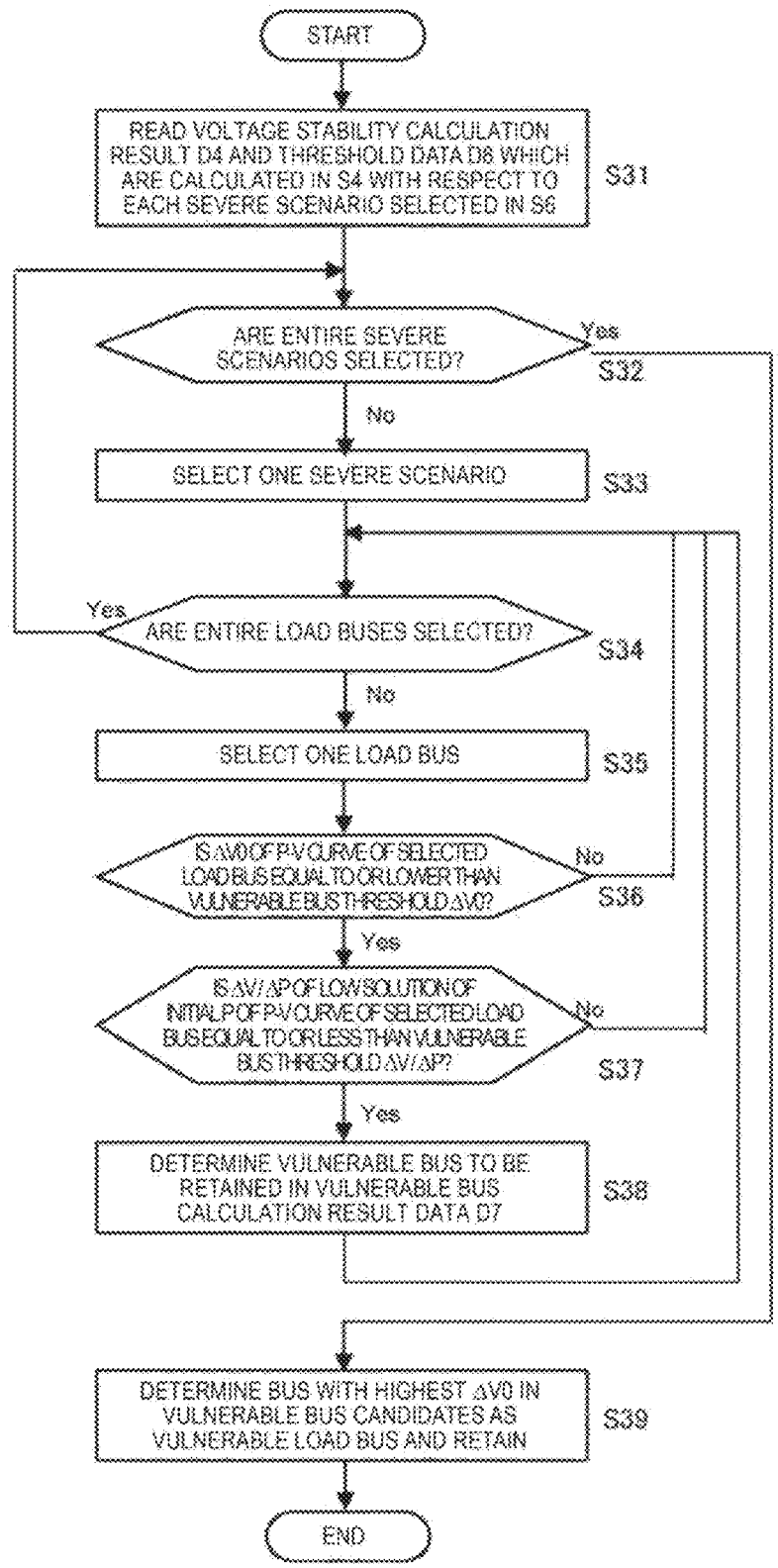

[Fig. 13]
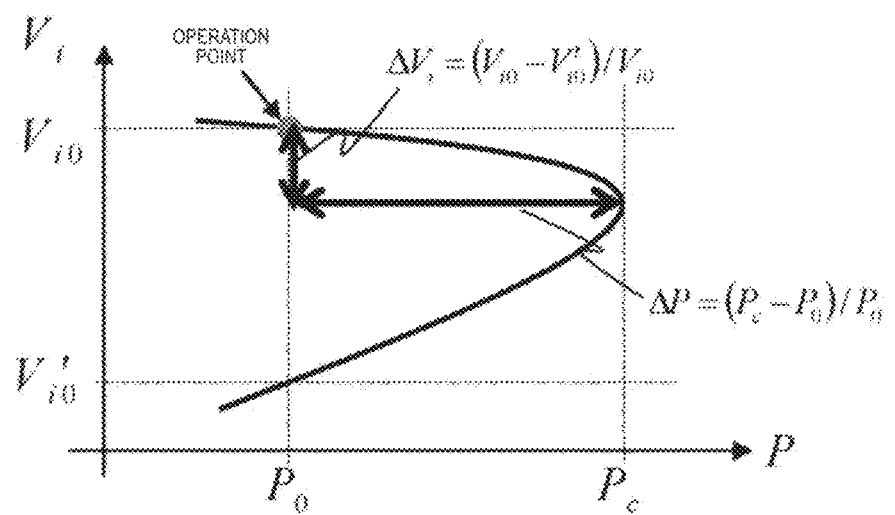

[Fig. 14]
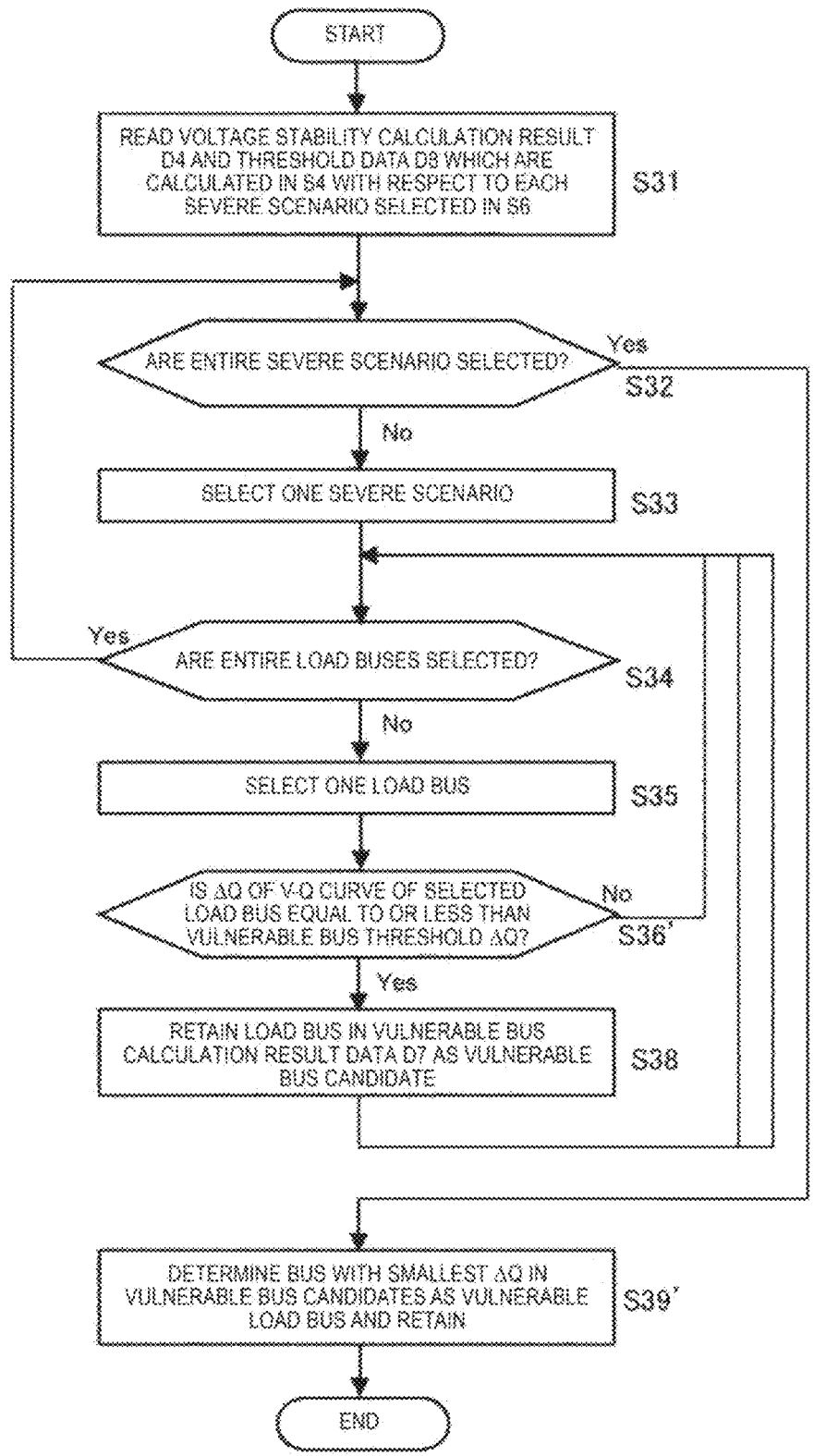

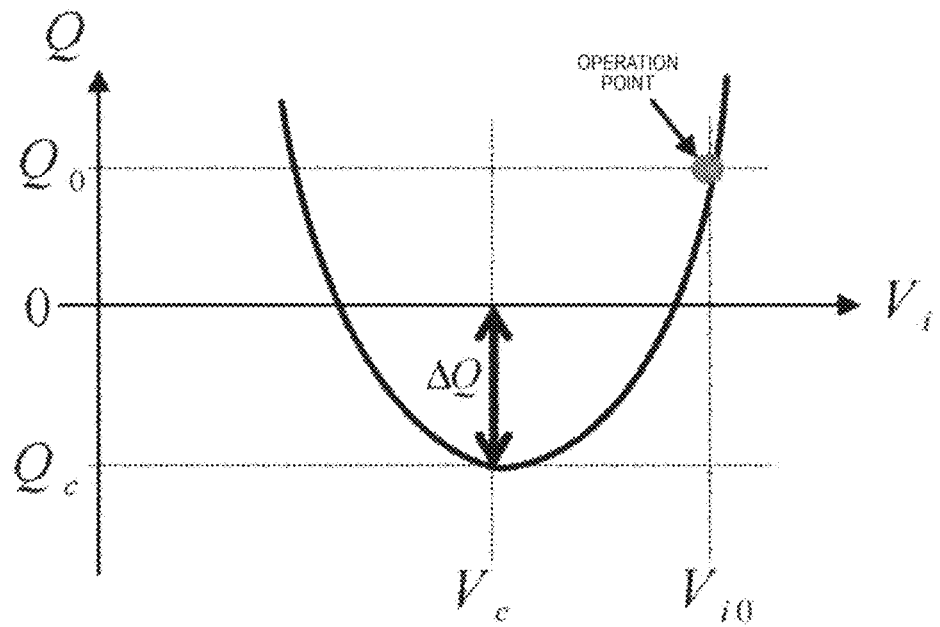
[Fig. 15]

[Fig. 16]
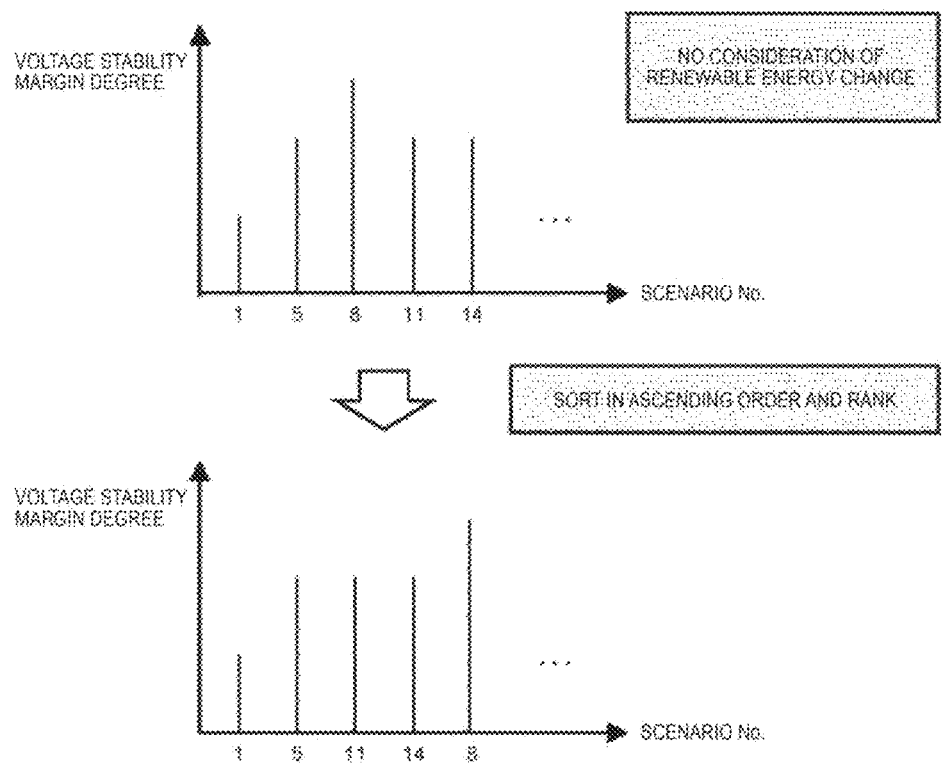

[Fig. 17]
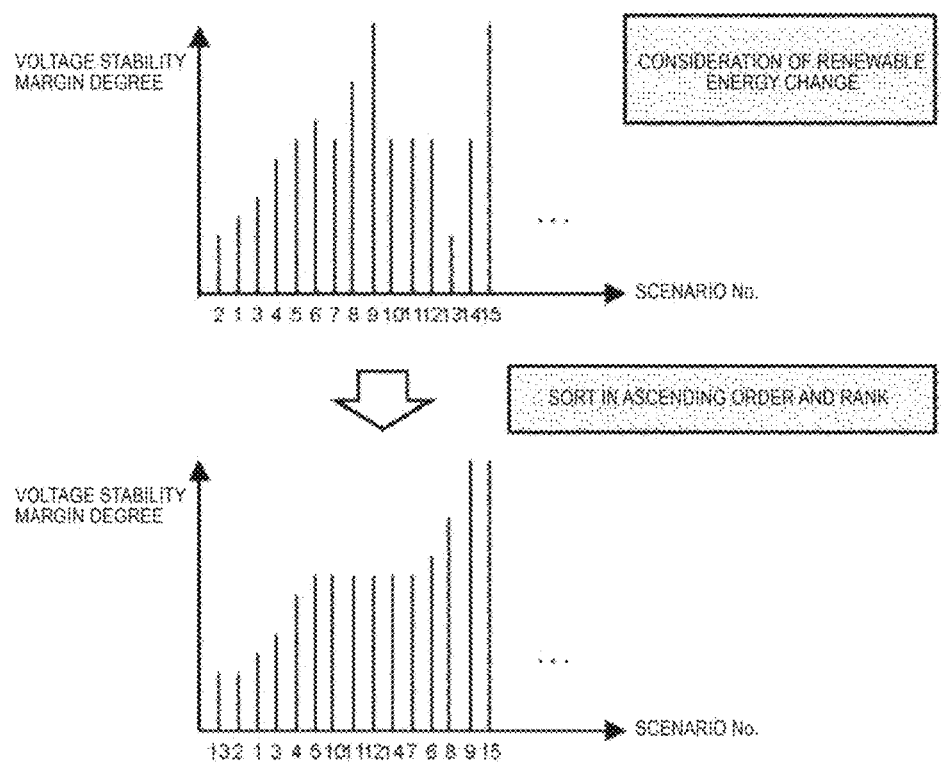

[Fig. 18]
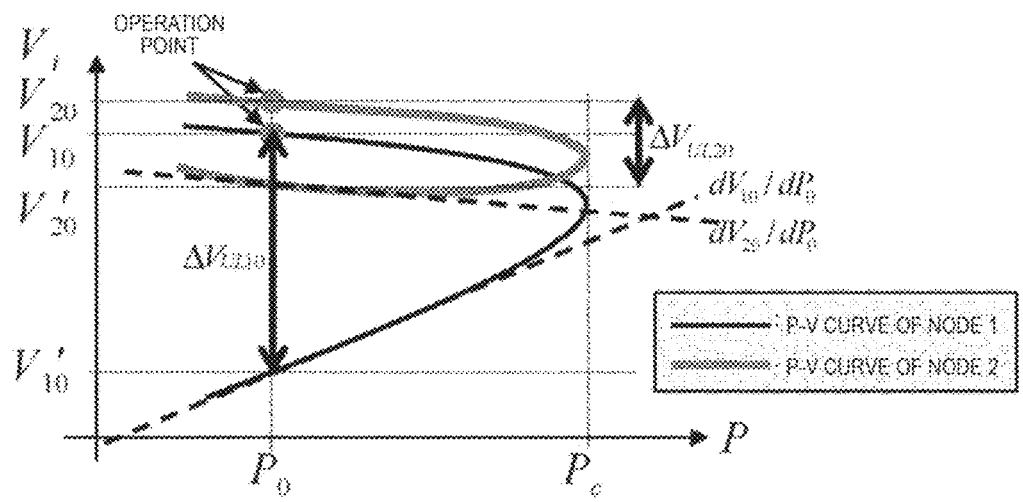
[Fig. 19]
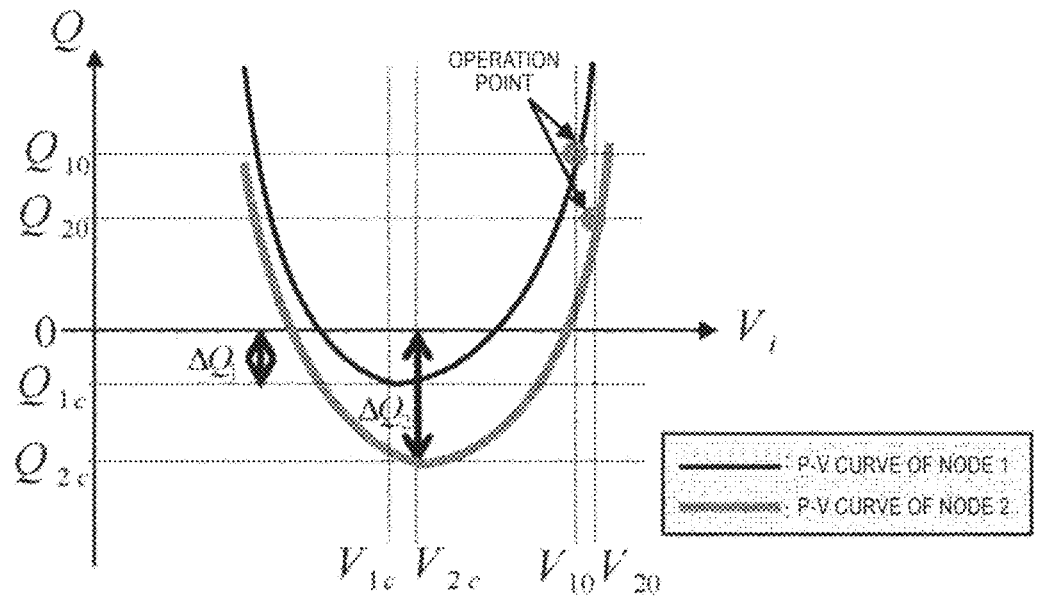

[Fig. 20]
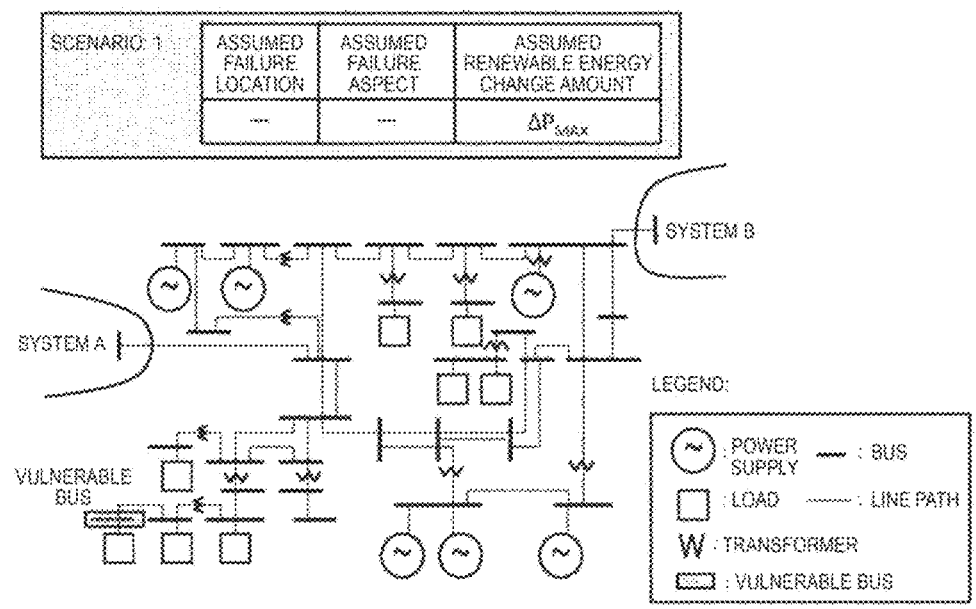

[Fig. 21]
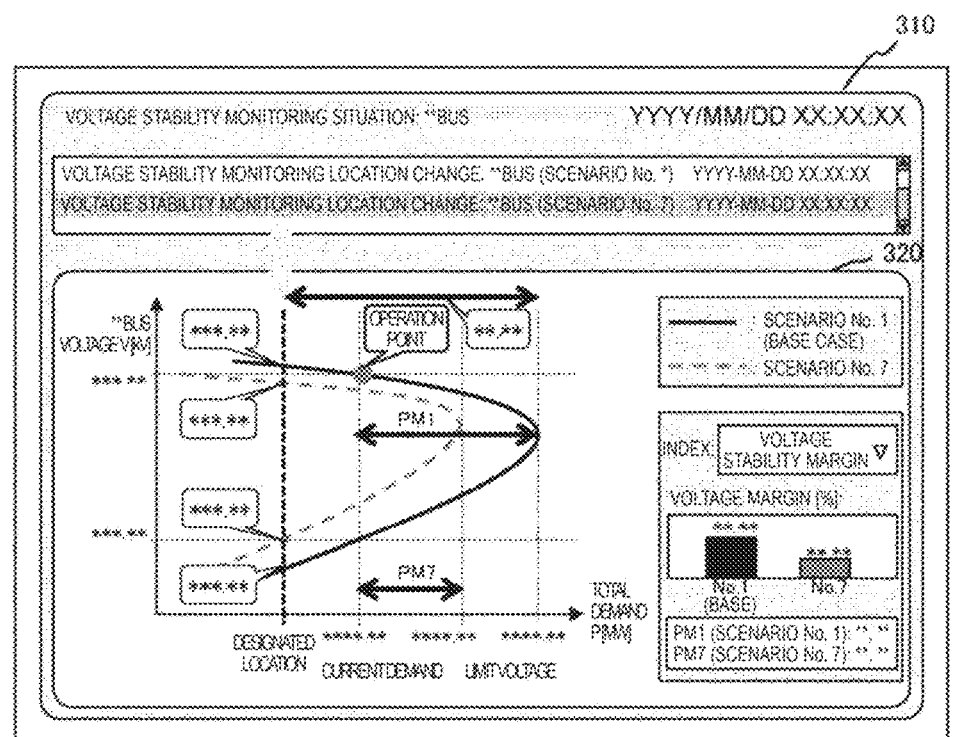

[Fig. 22]
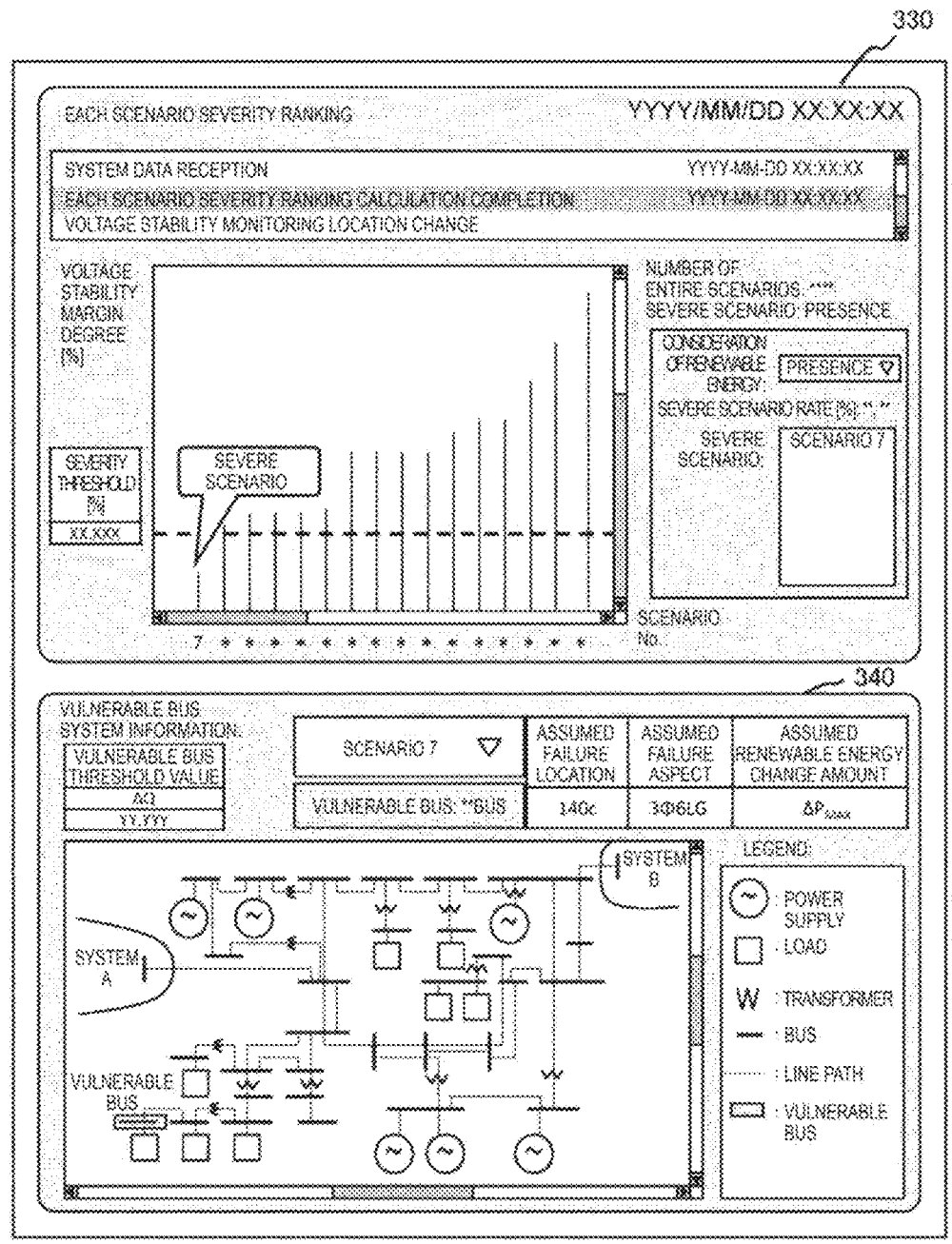

[Fig. 23]
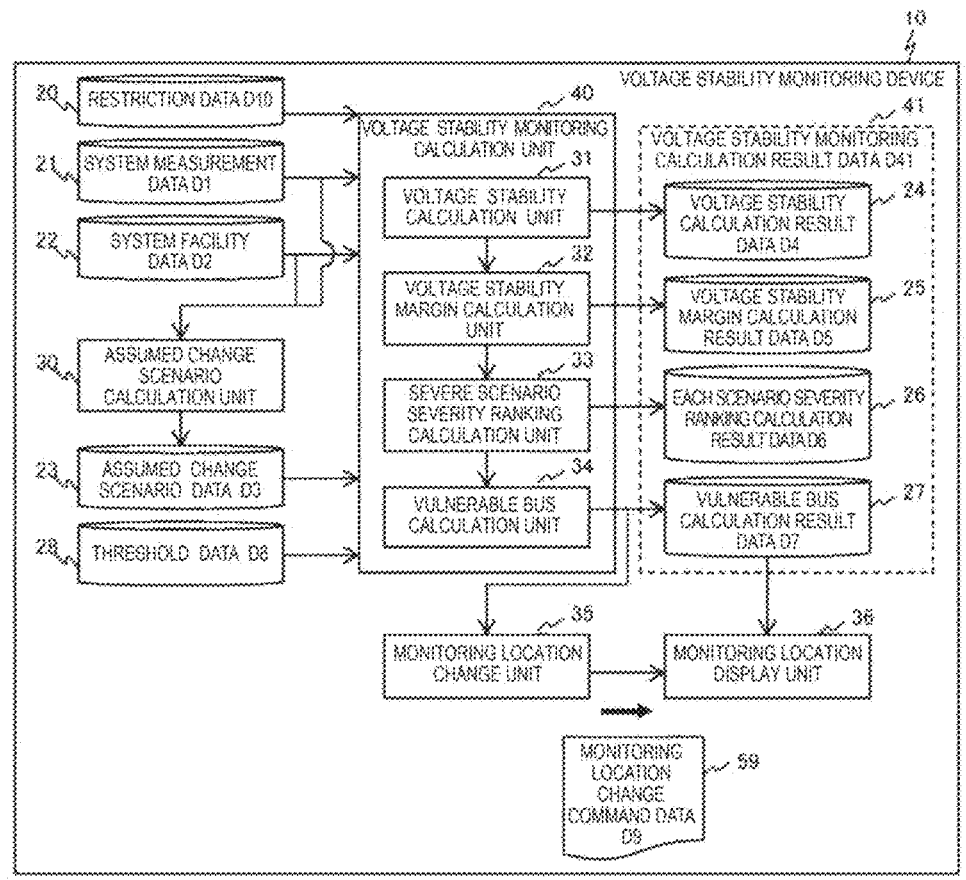

[Fig. 24]

| BUS No. | ACTIVE POWER RESTRICTION | REACTIVE POWER RESTRICTION | POWER FACTOR RESTRICTION | ... |
|---|---|---|---|---|
| *** | $P_{MAX}$ | $Q_{MAX}$ | $\cos\Phi_{MAX}$ | ... |
| *** | *** | *** | *** | ... |
| : | : | : | : | ... |

[Fig. 25]
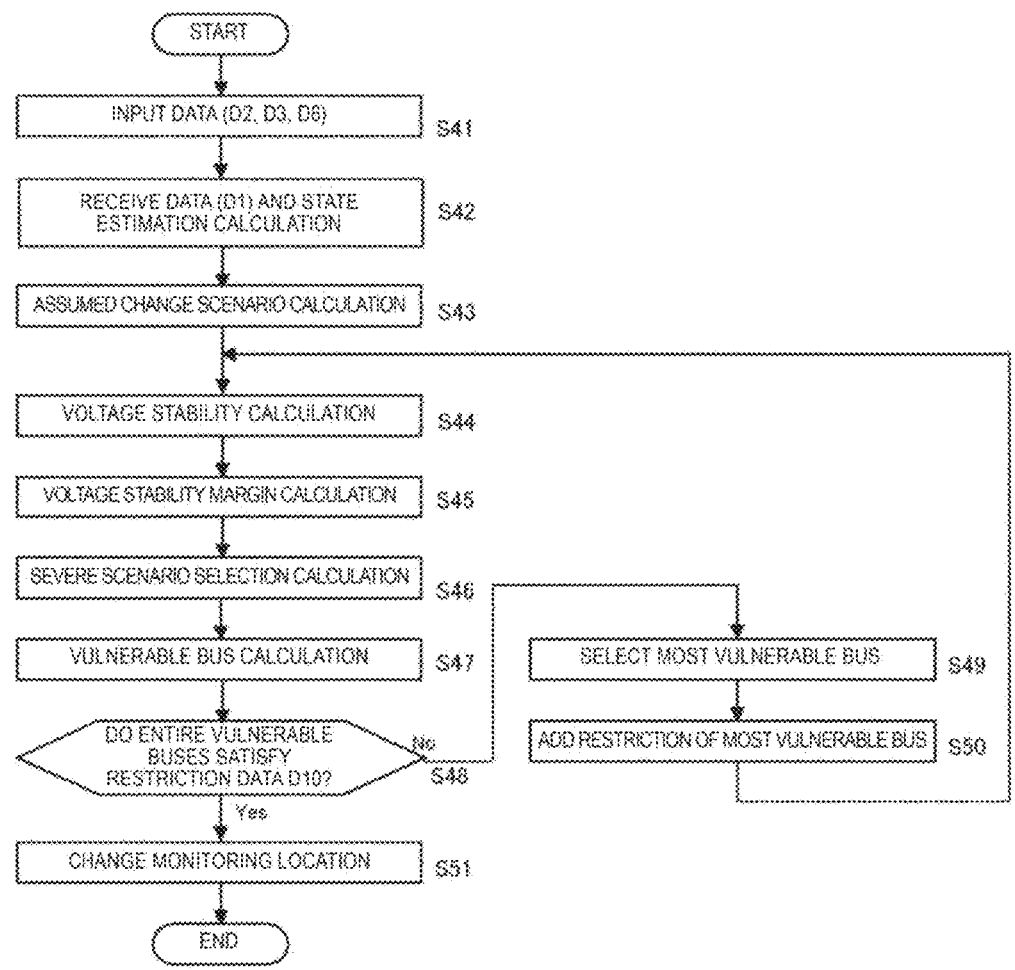

[Fig. 26]
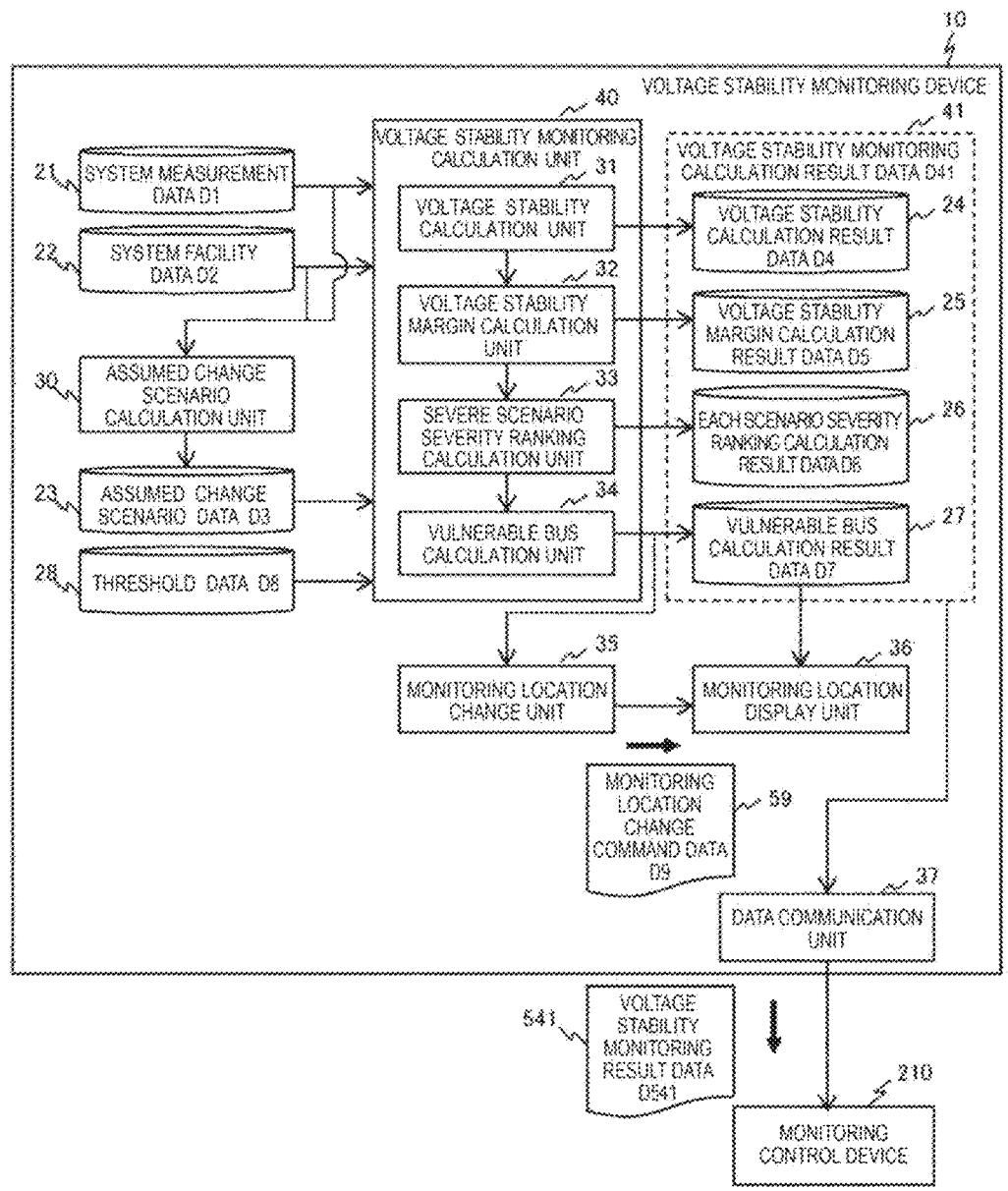

VOLTAGE STABILITY MONITORING DEVICE AND METHOD

TECHNICAL FIELD

The present invention relates to a voltage stability monitoring device which monitors voltage stability (also referred to as voltage stableness) of a power system.

BACKGROUND ART

In future, in addition to renewable energy (solar power generation, wind power generation, or the like), lots of power supplies (output variation type power supplies) whose outputs fluctuate depending upon weather are expected to be employed in large quantity in a power system. In addition, recently, power liberalization has been proceeded in the world, and as a result, facility investment of the power system is suppressed, and a power flow flowing through an existing transmission line increases (becomes a heavy tide). If tide variation (tide change) increases in a heavy tide state, voltage stability of a power system can deteriorate. Furthermore, if the system fails due to lightning strike or the like, voltage stability of the power system can further deteriorate. It is necessary to provide a voltage stability monitoring device which can accurately monitor a deterioration phenomenon of the voltage stability.

A background technique of the present technical field is descried in, for example, Mamoru Suzuki, Yukio Kishida: "Voltage Stability Online Monitoring System", Institute of Electrical Engineers of Theory B, Vol. 111, No. 3, 1991 (NPL 1). The review paper describes "Online Periodic Monitoring Function" and "Stability Determining Function at the Time of Peak Load" (refer to pp. 248-251 of text).

In addition, there is JP-A-2011-115024 (PTL 1). In PTL 1, a voltage reactive power monitoring system is described which coincides with motion of entirety of an actual power system in a case of being viewed from the entire power system, by determining a P-V curve after optimal tide calculation is performed to minimize a predetermined object function, or setting state variables of the entire load buses which are involved in a power system within a predetermined specified value.

In addition, there is JP-A-2005-287128 (PTL 2). In PTL 2, a power system stability monitoring system is described which can monitor stability of a system voltage while also accurately following control of a transformer tab or the like, since a P-V curve is drawn with high accuracy and at a high speed and the P-V curve traces a continuous load.

CITATION LIST

Patent Literature

PTL 1: JP-A-2011-115024
PTL 2: JP-A-2005-287128

Non-Patent Literature

NPL 1: Mamoru Suzuki, Yukio Kishida: "Voltage Stability Online Monitoring System", Institute of Electrical Engineers of Theory B, Vol. 111, No. 3, 1991

SUMMARY OF INVENTION

Technical Problem

The voltage stability monitoring device of the related art described in NPL and PTLs can monitor a possibility of deterioration of voltage stability by assuming any one or both of assumption of a tide change and failure (breakdown).

However, a monitoring location of the voltage stability monitoring device of the related art is set to have a substation bus which is important for transmission and reception of power, or each bus which is known that voltage stability is deteriorated by experience of an operator, as a target, and thus, if rapid tide variation or the like, which is caused by weather, of renewable energy that is introduced into a location of a unpredictable system occurs in future differently from a facility plan of a system so far, there is a possibility that the voltage stability of a bus in a monitoring location of the voltage stability monitoring device of the related art, or not in the monitoring location of the voltage stability monitoring device of the related art deteriorates. As a result, one or both of deterioration of current voltage stability and deterioration of future voltage stability are not able to be accurately monitored, and there is a problem in which one or both of the deterioration of the current voltage stability and the deterioration of the future voltage stability occur.

Solution to Problem

In order to solve the problems, the present invention provides a voltage stability monitoring device, which monitors voltage stability of a power system, including an assumed change scenario calculation unit which produces a plurality of assumed change scenarios indicating a scenario of a change that is assumed based on at least one of a system configuration of the power system and a change of a tide state; a voltage stability calculation unit which calculates the voltage stability using the assumed change scenario; a voltage stability margin calculation unit which calculates a voltage stability margin indicating margin degree of the voltage stability, based on the voltage stability; an each scenario severity ranking calculation unit which selects an assumed change scenario with high severity of the voltage stability for each assumed change scenario, based on the voltage stability margin; a vulnerable bus calculation unit which calculates which of buses in the power system is a vulnerable bus that decreases voltage stability, based on the assumed change scenario which is selected; and a monitoring location change unit which changes a monitoring target of the voltage stability, based on information of the vulnerable bus.

Advantageous Effects of Invention

According to the present invention, an assumed change scenario in which an output change of renewable energy is considered is automatically calculated, and thus, efforts of an operator are reduced. In addition, voltage stability monitoring calculation is performed with respect to the assumed change scenario, and thus, a bus in which deterioration of current or future voltage stability occurs varies dynamically, and the deterioration of the current or future voltage stability can be accurately monitored.

BRIEF DESCRIPTION OF DRAWINGS

FIG. 1 is an example of an entire configuration diagram of a voltage stability monitoring device.

FIG. 2 is an example of an entire configuration diagram of a hardware configuration of the voltage stability monitoring device and a power system.

FIG. 3 is an example of a configuration diagram illustrating content of program data of the voltage stability monitoring device.

FIG. 4 is a diagram illustrating an example of assumed change scenario data.

FIG. 5 is a diagram illustrating an example of a vulnerable bus threshold in a case where severity thresholds, P-V curves, and V-Q curves with respect to threshold data are used.

FIG. 6 is an example of a flowchart illustrating entire processing of the voltage stability monitoring device.

FIG. 7 is an example of a flowchart illustrating processing of an assumed change scenario calculation unit.

FIG. 8 is an example of a diagram illustrating a drawing image in which P-V curves are produced by continuation type tide calculation.

FIG. 9 is an example of a processing flow which produces the P-V curves by using the continuation type tide calculation and determines a limit of voltage stability.

FIG. 10 is an example of a diagram in which voltage vectors and load parameters are denoted as variables that are determined by a pseudo arc length.

FIG. 11 is an example of a flowchart illustrating processing of each scenario severity ranking calculation unit.

FIG. 12 is an example of a flowchart illustrating processing of a vulnerable bus calculation unit.

FIG. 13 is an example of a diagram illustrating voltage stability calculation results and voltage stability margin calculation results.

FIG. 14 is an example of a flowchart illustrating processing of the vulnerable bus calculation unit.

FIG. 15 is an example of a diagram illustrating the voltage stability calculation results and the voltage stability margin calculation results.

FIG. 16 is an example of a diagram illustrating ranking results in which the voltage stability margin calculation results of each assumed change scenario in which a renewable energy change with respect to each scenario severity ranking calculation unit is not considered are used.

FIG. 17 is an example of a diagram illustrating ranking results in which the voltage stability margin calculation results of each assumed change scenario in which a renewable energy change with respect to each scenario severity ranking calculation unit is considered are used.

FIG. 18 is an example of a diagram illustrating calculating of a calculation value required for selecting a vulnerable bus by using P-V curves with respect to the vulnerable bus calculation unit.

FIG. 19 is an example of a diagram illustrating calculating of a calculation value required for selecting a vulnerable bus by using V-Q curves with respect to the vulnerable bus calculation unit.

FIG. 20 is an example of a diagram illustrating bus locations in the power system in the vulnerable bus calculation results.

FIG. 21 is a diagram illustrating an example of a screen which displays the voltage stability calculation results and the voltage stability margin calculation results as a voltage stability monitoring situation.

FIG. 22 is a diagram illustrating an example of a screen which displays each scenario severity ranking results and vulnerable bus system information.

FIG. 23 is an example of an entire configuration diagram of the voltage stability monitoring device having restriction data.

FIG. 24 is a diagram illustrating an example of the restriction data.

FIG. 25 is an example of a flowchart illustrating the entirety of processing of the voltage stability monitoring device including a flow of vulnerable bus calculation having the restriction data.

FIG. 26 is an example of an entire configuration diagram of the voltage stability monitoring device to which threshold data, a data transmission unit, and a monitoring control device are added.

DESCRIPTION OF EMBODIMENTS

Hereinafter, embodiments suitable for realizing the present invention will be described. Meanwhile, the following embodiments are simply examples, and specific content thereof is not intended to limit the present invention.

Embodiment 1

The present embodiment is an example of a voltage stability monitoring device 10 which performs each scenario severity ranking calculation and vulnerable bus calculation, outputs monitoring location change command data D9, and performs monitoring location display, based on results which are obtained by calculating an assumed change scenario from system data D1 and system facility data D2 and performing voltage stability calculation and voltage stability margin calculation, using the calculated assumed change scenario data D3, the system data D1, the system facility data D2, and threshold data D8. An example of an entire configuration that is configured with input and output in which a database and data show content and processing in which a calculation unit shows content is illustrated in FIG. 1. Subsequently, an example of a hardware configuration of a power system 100, a monitoring control device 210, the voltage stability monitoring device 10, a measurement device 44, a power supply 110, a load 150, a bus, a transformer, and a power transmission line is illustrated in FIG. 2.

FIG. 1 is an example of an entire configuration diagram of the voltage stability monitoring device 10 according to the present embodiment and is a diagram illustrating a configuration of the voltage stability monitoring device 10 which is configured with the system data D1, the system facility data D2, an assumed change scenario calculation unit 30, the assumed change scenario data D3, the threshold data D8, a voltage stability monitoring calculation unit 40 which is configured with a voltage stability calculation unit 31, a voltage stability margin calculation unit 32, an each scenario severity ranking calculation unit 33, and a vulnerable bus calculation unit 34, a voltage stability monitoring calculation result data D41 which is configured with voltage stability calculation result data D4, voltage stability margin calculation result data D5, each scenario severity ranking calculation result data D6, and vulnerable bus calculation result data D7, a monitoring location change unit 35, the monitoring location change command data D9, and a monitoring location display unit 36.

Input data of the voltage stability monitoring device 10 is configured with the system data D1, the system facility data D2, the assumed change scenario data D3, and the threshold data D8. The assumed change scenario calculation unit 30 of the voltage stability monitoring device 10 calculates the assumed change scenario data D3 by using the system data D1 and the system facility data D2. In addition, the voltage stability calculation unit 31 of the voltage stability monitoring device 10 performs voltage stability calculation by using the system data D1, the system facility data D2, and the assumed change scenario data D3, and outputs the voltage stability calculation result data D4. In addition, the voltage stability margin calculation unit 32 of the voltage stability monitoring device 10 performs voltage stability margin calculation by using the voltage stability calculation result data D4, and outputs the voltage stability margin calculation result data D5. In addition, the each scenario severity ranking calculation unit 33 of the voltage stability monitoring device 10 performs each scenario severity ranking calculation by using the voltage stability calculation result data D4, the voltage stability margin calculation result data D5, and the threshold data D8, and outputs the each scenario severity ranking calculation result data D6. In addition, the vulnerable bus calculation unit 34 of the voltage stability monitoring device 10 performs vulnerable bus calculation by using the voltage stability calculation result data D4, the voltage stability margin calculation result data D5, the each scenario severity ranking calculation result data D6, and the threshold data D8, and outputs the vulnerable bus calculation result data D7. In addition, the monitoring location change unit 35 of the voltage stability monitoring device 10 transmits the monitoring location change command data D9 for changing a monitoring location by using the vulnerable bus calculation result data D7 to the monitoring location display unit 36. In addition, the monitoring location display unit 36 of the voltage stability monitoring device 10 displays the monitoring location by using the monitoring location change command data D9, and displays information of the monitoring location by using voltage stability monitoring calculation result data D41.

FIG. 2 is an example of an entire configuration diagram of a hardware configuration of the voltage stability monitoring device 10 and the power system 100, and is a diagram illustrating an example of a hardware configuration of the power system 100, the monitoring control device 210, the voltage stability monitoring device 10, the measurement device 44, the power supply 110, the load 150, the bus, the transformer, and the power transmission line. The power system 100 is connected to devices through a branch (line path) 140 and a node (bus) 120, and is configured with one or more of the power supply 110, the transformer 130, the measurement device 44, the load 150, and other measurement device or a controllable device (a battery, a chargeable or dischargeable secondary battery, an EV battery, a flywheel, or the like)(not illustrated).

Here, an example of the power supply 110 includes a large power supply, such as a thermal power generator, a hydroelectric generator, and a nuclear power generator, and a distribution type power supply, such as a solar power generator or a wind power generator.

Here, an example of the measurement device 44 is a device (VT, PT, or CT) which measures one or more of a node voltage V, a branch current I, a power factor Φ, active power P, and reactive power Q, and has a function of transmitting data including data measurement location identification ID and a time stamp embedded in a measurement device (telemeter (TM) or the like). The measurement device may be a device which measures power information (voltage phasor information) with an absolute time using a GPS, a phasor measurement unit (PMU), or other measurement devices. It is described as the measurement device 44 is included in the power system 100, but the measurement device may be provided on the bus, the power transmission line, or the like which is connected to the power supply 110, a transformer 130, the measurement device 44, and the load 150.

Here, the measurement data D1 is each of the data measured by the measurement device 44, and is received to a system measurement database 21 through a communication network 300. However, instead of receiving the system data directly from the measurement device 44, the system data may be aggregated in the monitoring control device 210 once, and then may be received to the system measurement database 21 through the communication network 300, and may be received to the system measurement database 21 from both the measurement device 44 and the monitoring control device 210 through the communication network 300. The measurement data D1 may include a unique number for identifying data, and a time stamp.

A configuration of the voltage stability monitoring device 10 will be described. A display unit 11, an input unit 12 such as a keyboard or a mouse, a communication unit 13, a computer or a computer server (CPU: Central Processing Unit) 14, a memory 15, and various databases (the system measurement database 21, a system facility database 22, an assumed change scenario database 23, a voltage stability calculation result database 24, a voltage stability margin calculation result database 25, an each scenario severity ranking calculation result database 26, a vulnerable bus calculation result database 27, a threshold database 28, and a program database 29) are connected to a bus line 43. The display unit 11 may be configured by, for example, a display device.

For example, the display unit 11 may be configured by using a printing device, a voice output device, or the like together with a display device, or instead of the display device. The input unit 12 can be configured to include at least one of a keyboard switch, a pointing device such as a mouse, a touch panel, a voice instruction device, and the like. The communication unit 13 includes a circuit and a communication protocol which are used for connecting the communication unit to the communication network 300. The CPU 14 reads a predetermined computer program to be executed from the program database 29. The CPU 14 may be configured with one semiconductor chip or a plurality of semiconductor chips, or may be configured with a computer device such as a calculation server. The memory 15 is configured with, for example, a random access memory (RAM), and stores a computer program which is read from the program database 29, or stores calculation result data, image data, and the like which are required for various types of processing. The image data stored in the memory 14 is transferred to the display unit 11 to be displayed. An example of a screen which displays the image data will be described below.

Here, content stored in the program database 29 will be described with reference to FIG. 3. FIG. 3 is an example of a configuration diagram illustrating content of program data of the voltage stability monitoring device. The program database 29 stores, for example, a state estimation calculation program P70, an assumed change scenario calculation program P10, a voltage stability calculation program P20, a voltage stability margin calculation program P30, an each scenario severity ranking calculation program P40, a vulnerable bus calculation program P50, and a monitoring location change program P60.

Returning to FIG. 2, the CPU 14 executes the calculation programs (the state estimation calculation program P70, the assumed change scenario calculation program P10, the voltage stability calculation program P20, the voltage stability margin calculation program P30, the each scenario severity ranking calculation program P40, the vulnerable bus calculation program P50, and the monitoring location change program P60) which are read from the program database 29 to the memory 14, and performs calculation of a plausible system state, calculation of an assumed change scenario, calculation of voltage stability, calculation of voltage stability margin, calculation of ranking of a severe scenario, calculation of selection of a severe scenario, calculation of a vulnerable bus, instruction of a monitoring location change, instruction of image data to be displayed, a search of data in various databases, and the like. The memory 14 is a memory which temporarily stores image data for display, monitoring data, calculation temporary data such as monitoring result data, and calculation result data once, and displays necessary image data which is generated by the CPU 14 on the display unit 11 (for example, display screen). The display unit 11 of the voltage stability monitoring device 10 may be only a simple screen only for performing rewriting of each control program or database.

The databases included in the voltage stability monitoring device 10 are largely divided into nine unit databases. The system measurement database 21, the system facility database 22, the assumed change scenario database 23, the voltage stability calculation result database 24, the voltage stability margin calculation result database 25, the each scenario severity ranking calculation result database 26, the vulnerable bus calculation result database 27, and the threshold database 28, except for the program database 29, will be described.

The system measurement database 21 includes the active power P, the reactive power Q, the voltage V, a voltage phase angle $\delta$, the current I, the power factor $\Phi$, and the like, as system measurement data. The data may be data with a time stamp or PMU data. For example, a voltage and a voltage phase angle at a node 120$a$ or 120$b$ which is connected to the power system 100, a line path tide (P+jQ) of a branch 140$a$ or 140$b$ which is connected to the node 120$a$ or 120$b$ that is connected to the power system 100, a line path tide (P+jQ) of a transformer 130$a$ or 130$b$ which is connected to the node 120$a$ or 120$b$ that is connected to the power system 100, a voltage V and the voltage phase angle $\delta$ of a node 121$a$ or 121$b$ which is connected to the transformer 130$a$ or 130$b$, the active power P, the reactive power Q, or the power factor $\Phi$ of the load 150 or the power supply 110 which is connected to the node 121$a$ or 121$b$, the active power P, the reactive power Q, the power factor $\Phi$, or the voltage V and the voltage phase angle $\delta$ of other nodes, other branches, other power supplies, other loads, other control devices, or the like which are connected to the power system 100 that performs measurement from the measurement device 44, the monitoring control device 210, or the like through a communication network, and the like are stored. The voltage phase angle $\delta$ may be measured by using other measurement instruments which use the PMU or the GPS. The measurement device is a VT, a PT, or the like. It is possible to calculate a line path tide (P+jQ) from the current I, the voltage V, and the power factor $\Phi$ which are measured by the VT, PT, and the like. In addition, results that are obtained by performing estimation calculation of the active power P, the reactive power Q, the voltage V, the voltage phase angle $\delta$, the current I, and the power factor $\Phi$ of each node, a branch, a power generator, a load, and a control device of a plausible system which are further received, which are calculation results of the state estimation calculation program P70, are also retained as system measurement data.

The system facility database 22 stores a system configuration, line path impedance (R+jX), capacitance with respect to ground (admittance: Y), data required for the system configuration and state estimation (threshold or the like of bad data), power generator data, and other data required for tide calculation, state estimation, and voltage stability calculation. A measurement value may be input from a monitoring control device, a central power supplying command location, or an EMS, and may be input from a measurement device of the entire system directly. When being input manually, the data is manually input by the input unit 12 to be stored. Necessary image data is generated by the CPU 14 and is displayed on the display unit 11. When the data is input, a complementary function is used, and the data may be input semi-manually such that a large amount of data can be set.

The assumed change scenario database 23 stores a failure location, a failure aspect, an assumed renewable energy change amount, and the like as a failure case that is assumed in the power system, which are stored by using the input unit 12 of the voltage stability monitoring device 10, and a list which is calculated by the assumed change scenario calculation program P10 from the failure location, the failure aspect, the assumed renewable energy change amount, and the like as the failure case that is assumed in the power system, as illustrated in FIG. 4, and which is obtained by combining the failure location, the failure aspect, the assumed renewable energy change amount, and the like as the failure case that is assumed in the power system. Failure removal timing or the like is included in the list as other elements. The assumed renewable energy change amount includes an output variation amount of solar power generation, wind power generation, mega solar, or a wind farm, or simultaneous dropping out or the like of the wind farm. The failure case may be only a severe failure case according to an operation of the system. The assumed change scenario data D3 may be set in advance without using the input unit 12, and may be set a value set by the monitoring control device 210 through the communication network 300 and the communication unit 13. There are effects that assumed change scenario data D3 can be flexibly set by such a setting method.

The voltage stability calculation result database 24 stores calculation results of continuation type tide calculation or the like for evaluating voltage stability, which is calculated by the voltage stability calculation program P20. For example, the calculation results are a P-V curve for each node illustrated in FIG. 13, a V-Q curve illustrated in FIG. 15, and the like. The continuation type tide calculation is a method of drawing the P-V curve or the V-Q curve by continuously calculating an operation, such as calculation (predictor calculation) changing load power or the like under a certain constant condition and predicting a system state, and obtaining a corresponding bus voltage using tide calculation (modifier calculation). The continuation type tide calculation will be described below in detail. For example, in a case of the P-V curve, the voltage stability calculation may be a change of a node voltage with respect to total demand, may be a change of a node voltage with respect to demand which is obtained by dividing the total demand by initial demand, may be a change of a node voltage with respect to demand of each node, and may be a change of a node voltage with respect to demand which is obtained by dividing the demand of each node by initial demand of each node. The change of a node voltage with respect to any one or more of the demands is stored.

Curves of FIG. 13 and FIG. 15 are drawn by using the P-V curve, the V-Q curve, or the like of the voltage stability calculation result data D4, which are calculated by the voltage stability margin calculation program P30, and then voltage margin $\Delta V$ and active power margin $\Delta P$ from a demand difference and a voltage difference between the tip of the P-V curve and a current operation point, and reactive power margin ΔQ from a demand difference between the tip of the V-Q curve and the current operating point are stored in the voltage stability margin calculation result database 25 for each node. In the same manner as the voltage stability calculation, also for the voltage stability margin, the P-V curve which is used when the voltage margin ΔV and the active power margin ΔP are obtained from, for example, the P-V curve may be a change of a node voltage with respect to total demand, may be a change of a node voltage with respect to demand which is obtained by dividing the total demand by initial demand, may be a change of a node voltage with respect to demand of each node, and may be a change of a node voltage with respect to demand which is obtained by dividing the demand of each node by initial demand of each node.

The each scenario severity ranking calculation result database 26 stores results which are obtained by performing ranking illustrated in FIG. 16 or FIG. 17 by sorting the each assumed change scenario in an ascending order, using the voltage stability margin calculation result data D5 corresponding to the each assumed change scenario, which is calculated by the each scenario severity ranking calculation program P40, and results in which a scenario equal to or less than a severity threshold is selected as a severe scenario by using the threshold data D8. The threshold data D8 will be described below in description of the threshold database 28.

The vulnerable bus calculation result database 27 stores a node number, a location, and the like so as to uniquely identify a vulnerable bus for the voltage stability, which are calculated by the vulnerable bus calculation program P50. For example, the vulnerable bus is calculated from comparison of $V_{UL10}$ and $V_{UL20}$ of each node, comparison of $\Delta Q_1$ and $\Delta Q_2$ of each node, or the like illustrated in FIG. 18 or FIG. 19, according to a constant reference. A method of calculating the vulnerable bus and the constant reference will be described below. The location which is stored is a position on a system diagram illustrated in, for example, FIG. 20.

The threshold database 28 stores a severity threshold or a vulnerable bus threshold illustrated in FIG. 5. The severity threshold is a threshold which is used for severe scenario severity ranking calculation, and is used for selecting a scenario equal to or less than the severity threshold as a sever scenario. In addition, the vulnerable bus threshold is a threshold which is used for vulnerable bus calculation, and is used for selecting a node equal to or less than the vulnerable bus threshold as a vulnerable bus.

Next, calculation processing content of the voltage stability monitoring device 10 will be described with reference to FIG. 6. FIG. 6 is an example of a flowchart illustrating entire processing of the voltage stability monitoring device. First, a flow will be simply described. After the system facility data D2, the assumed change scenario data D3, and the threshold data D8 are input and stored, the system measurement data D1 is received, state estimation calculation is performed, and state estimation calculation results are stored. Subsequently, an assumed change scenario is calculated by using the system facility data D2, the assumed change scenario data D3, and the state estimation results (stored in the assumed change scenario database 23). Subsequently, voltage stability calculation is performed by using the state estimation calculation results (stored in the system measurement database 21) and the each assumed change scenario, and thereafter, voltage stability margin calculation is performed, and the voltage stability calculation results and the voltage stability margin calculation results are stored. Subsequently, severe scenario severity ranking calculation is performed by using the voltage stability margin calculation result D5 and the threshold data D8, and severe scenario severity ranking calculation results are stored. Subsequently, vulnerable bus calculation is performed by using the severe scenario severity ranking calculation result D6 and the threshold data D8, and vulnerable bus calculation results are stored. Finally, a flow is performed in which a monitoring location change is performed on the vulnerable bus or in locations where there are many vulnerable buses, by using the vulnerable bus calculation result D7. The monitoring location may display a plurality of locations, or may display the most vulnerable bus. Data which is accumulated in the memory as the various calculation results or during the calculation may be sequentially displayed on a screen of the monitoring control device 210. Thereby, an operator can easily grasp an operation situation of the voltage stability monitoring device 10. In addition, monitoring content (producing of vulnerable bus) or the like is displayed as an operation situation in the voltage stability monitoring device 10. Thereby, the operator can easily grasp the operation situation of the voltage stability monitoring device 10. Situation displaying on the screen until various data is received and various calculation results are respectively transmitted is repeated until the monitoring location change is performed. The flow of the aforementioned processing will be described for each step.

First, in step S1, the system facility data D2, the assumed change scenario data D3, and the threshold data D8 are input by using the input unit 12 and the display unit 11, in a case where the system facility data D2, the assumed change scenario data D3, and the threshold data D8 are not set in advance. Here, the data may be input from the monitoring control device 210 through the communication network 300 and the communication unit 13, and the data related to the system facility data D2, the assumed change scenario data D3, and the threshold data D8 which are stored in the monitoring control device 210 or the like may be automatically received at a constant cycle and stored. In addition, in a case where the system facility data D2, the assumed change scenario data D3, and the threshold data D8 are set in advance, the data may be modified or may be used as it is.

In step S2, the system measurement data D1 is received, the state estimation calculation is performed, and the state estimation calculation results are stored in the system measurement database 21. Results which are obtained by performing estimation calculation of the active power P, the reactive power Q, the voltage V, the voltage phase angle δ, the current I, and the power factor Φ of each node, the branch, the power generator, the load, and the control device of a plausible system, using the state estimation calculation is also stored as system measurement data. A method of the state estimation calculation is performed in line with a calculation method or the like described in, for example, Lars Holten, Anders Gjelsvlk, Sverre Adam, F. F. Wu, and Wen-Hs Iung E. Liu, Comparison of Different Methods for State Estimation, IEEE Transaction on Power Systems, Vol. 3 (1988), pp. 1798-1806.

In step S3, the assumed change scenario calculation is performed by using the system facility data D2 and the assumed change scenario data D3 which are stored in step S1, and the state estimation results which are obtained in step S2, and the results are stored in the assumed change scenario database 23.

Here, a flow of the assumed change scenario calculation will be described with reference to FIG. 7. FIG. 7 is an example of a flowchart illustrating processing of the assumed change scenario calculation unit 30. FIG. 7 illustrates a method of repeatedly calculating a flow in which after the system measurement data D1 and the system facility data D2 are read and assumed failure location and aspect are selected, the assumed renewable energy change amount is selected and stored as the assumed change scenario data D3, until selection of the assumed failure location, the assumed failure aspect, and the assumed renewable energy change amount is ended, through steps S11 to S18. A flow of the aforementioned processing will be described hereinafter. In step S11, the system measurement data D1 and the system facility data D2 which are input, received, and calculated in step S1 and step S2 are read, and are read into the memory 14. In step S12, any one of unselected locations in the list of the assumed failure locations that are read into the memory 14 is selected. In step S13, any one of unselected aspects in the list of the assumed failure aspects that are read into the memory 14 is selected. In step S14, any one of unselected amounts in the list of the assumed renewable energy change amounts that are read into the memory 14 is selected. In step S15, combinations of the assumed failure location, the assumed failure aspect, and the assumed renewable energy change amount which are selected in steps S12 to S14 are stored as one piece of the assumed change scenario D3. In step S16, the processing returns to step S14, in a case where the list of the entire assumed renewable energy change amount is not selected. In addition, in step S16, the processing proceeds to step S17, in a case where the list of the entire assumed renewable energy change amount is selected. In step S17, the processing returns to step S13, in a case where the list of the entire assumed failure aspects is not selected. In addition, in step S17, the processing proceeds to step S18, in a case where the list of the entire assumed renewable energy change amounts is selected. In step S18, the processing returns to step S12, in a case where the list of the entire assumed failure locations is not selected. In addition, in step S17, the flow ends, in a case where the list of the entire assumed failure locations is selected. Here, it is considered that an output of the assumed renewable energy change amount is not changed, is decreased (during a certain constant period), is increased (during a certain constant period), or the like. In addition, the assumed renewable energy change amount may be updated based on the data which is manually input for a predetermined period or stored in the monitoring control device or the database. Here, as the combination of the assumed failure location, the assumed failure aspects, and the assumed renewable energy change amount, a combination of only the assumed renewable energy change amounts which includes no failure location and failure aspects also exist.

Here, an example of the assumed change scenario data D3 will be described with reference to FIG. 4. As illustrated in FIG. 4, the failure case which is assumed in the power system includes the list in which a failure location, a failure aspect, the assumed renewable energy change amount, and the like are combined. The list includes failure removal timing and the like which are other elements. The assumed renewable energy change amount includes an output variation amount of solar power generation, wind power generation, mega solar, or wind farm, or simultaneous dropping out or the like of the wind farm. The failure case may be only a severe failure case according to an operation of the system. In addition, the assumed renewable energy change amount may not be set. The assumed change scenario data D3 may be set in advance without using the input unit 12, or a value which is set by the monitoring control device 210 may be set through the communication network 300 and the communication unit 13. There is an effect in which the assumed change scenario data D3 can be flexibly set by such setting methods.

Returning to FIG. 6, here in step S4, the voltage stability calculation is performed by using the state estimation calculation results and the each assumed change scenario, and thereafter, voltage stability calculation results are stored. A method of the voltage stability calculation is performed in line with a calculation method or the like described in, for example, PTL 2, Chiang. H. D. et al., "CPFLOW: A Practical Tool for Tracing Power System Steady-State Stationary Behavior Due to Load and Generation Variations", IEEE Trans, on Power Systems, Vol. 10, No. 2, pp. 623-634, 1995, Venkataramana Ajjarapu, "Computational Techniques for Voltage Stability Assessment and Control", Springer, 2006, pp. 49-116, JP-A-6-153397, or the like.

The method of the voltage stability calculation is generally termed a continuation type tide calculation, and is a method which employs a continuation method, based on concept of a predictor-modifier method which is a method of analyzing a non-linear function. By producing the P-V curve using the method, effects can be obtained in which solution is stably obtained also in the periphery of active power limit which is a limit of the voltage stability, and the active power limit can be accurately obtained. Furthermore, if the continuation type tide calculation is used, voltage-low solution can be stably obtained. Thereby, there is an effect in which a difference $\Delta V$ between high solution and low solution of the operation point which is used for evaluation of the voltage stability can be obtained.

Here, the P-V curve is produced by the continuation type tide calculation, and processing of determining a limit of the voltage stability will be schematically described hereinafter.

A drawing image of the P-V curve is illustrated in FIG. 8. In addition, a processing flow is illustrated in FIG. 9.

First, predictor calculation will be described. An object of the predictor is to obtain a prediction point for obtaining the next solution. Since the prediction point becomes an initial value of modifier calculation (tide calculation), the higher the quality of the prediction point is, the more the repeated calculation of the modifier for obtaining a correct solution decreases.

A method of calculating the predictor can be largely divided into a linear predictor and a non-linear predictor. The linear predictor includes (a) predictor of a simple increase, (b) predictor of a secant method, (c) predictor of a tangent line method, and the like, and the non-linear predictor includes (d) predictor of a parabola, and the like. Predictor calculation of any one of (a) to (d) or a combination of any one of (a) to (d) may be performed. (a) The predictor of a simple increase is a method of obtaining the predictor by simply increase $\lambda$. (b) The predictor of a secant method is a method by which a secant passing through a preceding convergence point ($\lambda'$, P') and a convergence point ($\lambda''$, P'') preceding to the preceding convergence point is drawn and the predictor is obtained on the straight line, which are described in Morihoka: "Continuation Type Tide Calculation Using Lagrange Interpolation Non-linear Predictor", Institute of Electrical Engineers of Theory B, Vol. 123, No. 4, 2003. (c) The predictor of a tangent line method is a method by which a tangent line is drawn with respect to the P-V curve of a preceding convergence points and the predictor is obtained on the tangent line, which are described in Fukuyamahoka: "Development of Continuation Power Flow Practicalization System", National Convention of Institute of Electrical Engineers, No. 1387, 1997. (d) The predictor of a parabola is a method by which a parabola is drawn by using a convergence point preceding a preceding convergence point and the predictor is obtained on the parabola.

Hereinafter, calculation which uses the predictors of (a) and (b) will be described. The amount of calculation is decreased by obtaining the prediction point using (a) the predictor of a simple increase only in the first step, and by performing calculation using (b) the predictor of a secant method in the second step or later. This is because convergence solutions of minimum two points are required so as to draw the secant. By combining calculations of the two predictors, a prediction point can be obtained by simple calculation, and thereby, there is an effect in which the amount of calculation can be decreased.

Control of a step width in the predictor calculation may be performed by any one, both, or the like of a binary search method by which a step width is controlled to be half, and control of increasing or decreasing a control coefficient (will be described below) of a step width according to the number of convergence calculation of calculation of a preceding modifier described in Venkataramana Ajjarapu, "Computational Techniques for Voltage Stability Assessment and Control", Springer, 2006, pp. 33-38, in a case where convergence is not performed. Hereinafter, a method of employing both methods will be described (hereinafter, referred to as control of number of times of convergence).

Specifically, a step width $\sigma$ is determined by the following expression, in the control of number of times of convergence of the latter.

$$^{(k+1)}\sigma = {}^{(k)}\sigma + \Delta\sigma \frac{N_{opt}}{{}^{(k)}N}$$

$$^{(k+1)}\sigma = {}^{(k)}\sigma + \Delta\sigma \frac{N_{opt}}{{}^{(k)}N}$$

Here, $^{(k)}\sigma$ is a current step width of the predictor, $^{(k+1)}\sigma$ is a step width of a next predictor, $\Delta\sigma$ is an increase in step widths, $N_{Opt}$ is the number of convergence calculation of optimal modifier calculation, $^{(k)}N$ is the number of convergence calculation of finally converged modifier calculation, and $$\frac{N_{opt}}{{}^{(k)}N}$$

is a control coefficient of the increase in step widths. $N_{opt}$ can be set to an arbitrary value initially, and is increased or decreased as necessary, in a case where a desired P-V curve is not able to be drawn. Thereby, there is an effect in which a desired P-V curve is able to be drawn. Here, the desired P-V curve is, for example, a P-V curve in which both high solution and low solution of a voltage are obtained up to active power of an operation point, a P-V curve in which a convergence point is between desired point number widths, and a P-V curve in which convergence point near a nose of the P-V curve is between the desired point number widths. This is because there is a case where the low solution side is not converged on the way before decreasing to the active power of the operation point, or a case where the number of point of the P-V curve increases or decreases, by a value of $N_{opt}$. The low solution side is also calculated to the active power of the operation point, and thereby $\Delta V_{UL10}$ or the like illustrated in FIG. 18 is calculated, and there is an advantage in which an index of voltage stability can be used. In addition, as the convergence point is between desired point number widths, there is an advantage in which the P-V curve can be adjusted to a desired accuracy.

The control of number of times of convergence is performed such that $^{(k)}N$ increases and the step width decreases, in a case where a tide state is hard to be converged, and is performed such that $^{(k)}N$ decreases and the step width increases, in a case where the tide state is easily converged. Thereby, the continuation type tide calculation is effectively performed.

In a case where calculation of the modifier is not converged, the control of number of times of convergence is switched to a binary search method until being converged. Here, in the convergence calculation of the calculation of one modifier, a case of being not converged is a case where counting is performed whenever a total sum of mismatches calculated in the nth time is greater than a total sum of mismatches calculated in the (n+1)th time and the counting exceeds number of times being set. However, a case of being reached number of times of an upper limit of convergence calculation which is set in advance uses Expression (1). If being converged, next step adjustment returns to the control of number of times of convergence of Expression (1). Thereby, although it is hard to converge to reach an upper limit of number of times of the convergence calculation, it is possible to obtain a stable solution. In addition, in the calculation of the modifier, a shape of the P-V curve becomes a quadratic curve, and thus, a predictor which is produced by using previous high solution of voltage of an active power limit and solution of the active power limit is far away from the low solution of voltage to be converged, and the number of times of the convergence calculation can increase. In the control of number of times of convergence, a next predictor is calculated by using Expression (1), and thus, when a point of the first low solution of voltage is obtained, $^{(k)}N$ can increase, $\Delta\sigma$ which obtains subsequent low solution of voltage can be less than a time when the high solution of voltage is obtained, and the amount of calculation can be increased by calculating the low solution of voltage at a fine unit. Hence, when the point of the first low solution of voltage is obtained, $^{(k+1)}\sigma$ is calculated by using magnification of the high solution of voltage less than magnification of the first low solution of voltage without using Expression (1). By doing so, there are effects in which calculation of the low solution of voltage can be performed at an appropriate point number and the amount of calculation can be reduced.

In a case where a load of calculation results of the modifier is less than the operation point, the calculation ends.

Subsequently, a method of calculating the modifier will be described. First, a load parameter $\lambda$ is considered as a variable, and a tide equation is formulated as Expression (2).

$$f(x,\lambda)=0 \quad (2)$$

However, x is a variable vector in which bus voltage values are arranged, and $\lambda$ is a variable vector in which load parameter values are arranged.

Specifically, Expression (2) is configured by the following three expressions.

$$f_{Pi}-(1+\lambda)f_{Psi}=0 \quad (3)$$

$$f_{Qi}-(1+\lambda)f_{Qsi}=0 (PQ \text{ index bus}) \quad (4)$$

$$f_{Vi}-(1+\lambda)f_{Vsi}=0 (PV \text{ index bus}) \quad (5)$$

Here, i is a node number, $f_{Pi}$ is active power in a bus i, $f_{Qi}$ is reactive power in the bus i, $f_{Vi}$ a function indicating a magnitude of a voltage in the bus i, $f_{Psi}$, $f_{Qsi}$, and $f_{Vsi}$ are respectively active power, reactive power, and a designated value of the magnitude of the voltage in the bus i, and λ is a load parameter.

Since one of Expression (4) and Expression (5) is not able to be designated, generally, a bus whose voltage control is not performed, such as a load bus, uses Expression (5) as PQ designation, and a bus whose voltage control is performed, such as a power generator bus, uses Expression (5) as PV designation.

In addition, as described in Chiang. H. D. et al., "CPFLOW: A Practical Tool for Tracing Power System Steady-State Stationary Behavior Due to Load and Generation Variations", a voltage vector and a load parameter are denoted as variables which are determined by a pseudo arc length (refer to FIG. 10).

$$x=x(s) \quad (6)$$

$$\lambda=\lambda(s) \quad (7)$$

However, x is a voltage vector, λ is a load parameter, and s is a pseudo arc length.

Here, the following conditions are given to Expression (6) and Expression (7).

$$\Sigma_{i=1}^{n}\{(x_i^{k+1}-x_i^k)^2\}+(\lambda_i^{k+1}-\lambda_i^k)^2=\Delta s^2 \quad (8)$$

However, x is a voltage vector, n is the number of nodes, i is a variable number, k is the number of steps, Δs is the amount of change of pseudo arc length.

Expression (8) denotes a hypersphere, and shows restriction which is the same as a value which is obtained by linearly approximating a partial P-V curve using a sum of increased amounts of the entire variables. By considering the expressions, a CPF method changes a condition in which Jacobian matrix becomes singular.

The continuation type tide calculation is solved by a Newton-Raphson method or the like at each time while active power and reactive power of simultaneous equations of Expression (6), Expression (7), and Expression (8) are changed, and thereby, the P-V curve is produced. A $\Delta x^{(l+1)}$ Newton-Raphson method is solved while the amount of modification $\Delta x^{(l+1)}$ is obtained by using Expression (9) and x is updated by Expression (10).

$$f(x^{(l)})=-J_{Aug}^{(l)}\Delta x^{(l+1)} \quad (9)$$

$$x^{(l+1)}=x^{(l)}+\Delta x^{(l+1)} \quad (10)$$

Here, $J_{Aug}$ is expanded Jacobian matrix which is obtained by partially differentiating f(x) using elements of x, and a right shoulder subscript (l) denotes the number of convergence calculation steps. A difference between the expanded Jacobian matrix and a Jacobian matrix which is used for normal tide calculation is that matrix of the load parameter λ is expanded. Thereby, convergence property can also be improved in the vicinity of an active power limit. x of Expression (9) and Expression (10) is represented such that λ is included therein. In addition, the Newton-Raphson method may be calculated by using a polar coordinate system, and may be calculated by using an orthogonal coordinate system. In addition, in order to solve a simultaneous equation using the Newton-Raphson method, LU decomposition or the like is used, but there is an effect in which the amount of calculation is reduced by performing calculation while fill-in is reduced by ordering. In a case where fast calculation is performed, normal tide calculation may be performed repeatedly only by a tide equation, without introducing Expression (8) of the tide equation and the pseudo arc length such as the continuation type tide calculation. Thereby, there is an advantage in which fast calculation is performed. However, in this case, since there is a possibility that the low solution of voltage is not obtained in P-V curve calculation, a voltage stability index which uses the low solution of voltage is not able to be used, and thus, the voltage stability index which uses the high solution of voltage from an operation point to a nose end is used.

Here, an example of the voltage stability calculation results will be described with reference to FIG. 13 and FIG. 15. FIG. 13 and FIG. 15 are examples illustrating images of the voltage stability calculation unit 31. FIG. 13 is an example which produces a P-V curve having a horizontal axis denoting a total demand P of active power and a vertical axis denoting a voltage $V_i$ of a node i. An operation point is $(P_0, V_{i0})$, and low solution which is a pair with the high solution is $(P_0, V'_{i0})$. Furthermore, the active power limit which is a limit of voltage stability is a location of $P_c$. Generally, the active power limit which is the tip of the P-V curve is termed a nose. FIG. 15 is an example of which produces a V-Q curve having a horizontal axis denoting the voltage $V_i$ of the node i and a vertical axis denoting a total demand Q of reactive power. An operation point is $(V_{i0}, Q_0)$. Furthermore, the reactive power limit which is a limit of voltage stability is a location of $Q_c$. The V-Q curve can be drawn by subtracting reactive power which is supplied from a system side from reactive power consumption of the node i. A function of voltage stability calculation in which restriction data of a power generator illustrated in FIG. 24 is considered is provided. Thereby, it is possible to review voltage stability of a power system closer to reality.

Returning to FIG. 6, here, in step S5, voltage stability margin calculation is performed, and voltage stability margin calculation results are stored. Here, an example of the voltage stability margin calculation results will be described with reference to FIG. 13 and FIG. 15. FIG. 13 and FIG. 15 are examples illustrating images of the voltage stability margin calculation unit 32. The voltage stability margin ΔP can be calculated from the P-V curve of FIG. 13 by Expression (11) which is a difference between $P_0$ of the operation point and an active power limit $P_c$. In addition, a voltage stability margin may be $\Delta V_i$ which is calculated by Expression (12).

$$\Delta P=(P_c-P_0)/P_0 \quad (11)$$

$$\Delta V_i=(V_{i0}-V'_{i0})/V_{i0} \quad (12)$$

In addition, a voltage stability margin ΔQ can be calculated from the V-Q curve of FIG. 15 by a difference ΔQ between reactive power Q=0 and a reactive power limit $Q_c$. In this way, there is an effect in which a system operator easily understands by using the voltage stability margin that is simply obtained from the P-V curve or the V-Q curve configured by physical quantity which is usually used by the system operator. However, voltage stability margins other than this may be calculated to be used. In addition, there is a case where the P-V curve or the V-Q curve is not written originally by the assumed change scenario. In such a case, it is considered that there is no operation point, and it is determined that there is no voltage stability margin.

Returning to FIG. 6, here, in step S6, severe scenario severity ranking calculation is performed by using the voltage stability margin calculation results D5 and the threshold data D8, and severe scenario severity ranking calculation results are stored.

Here, a flow of the severe scenario severity ranking calculation will be described with reference to FIG. 11. FIG. 11 is an example of a flowchart illustrating processing of the severe scenario severity ranking calculation unit 33. Through steps S21 to S26 of FIG. 11, the voltage stability margin calculation result data D5 and the threshold data D8 which are calculated in step S5 are read, the each assumed change scenario is sorted in an ascending order of the voltage stability margin to be stored in the each assumed change scenario severity ranking calculation result data D6, one of the assumed change scenarios is selected, and if the voltage stability margin of the selected assumed change scenario is less than a threshold, a sever scenario is selected, and severe scenario information is additionally stored in the each assumed change scenario severity ranking calculation result data D6. Meanwhile, if the voltage stability margin of the selected assumed change scenario is equal to or greater than the threshold, one of next assumed change scenario is selected. A method of calculating repeatedly the above processing until selection of the entire assumed change scenarios is completed will be described. A flow of the aforementioned processing will be described hereinafter. In step S21, the voltage stability margin calculation result data D5 and the threshold data D8 which are calculated in step S5 are read to be stored in the memory 14. In step S22, the voltage stability margins of the each assumed change scenario which is read into the memory 14 are sorted in an ascending order to be retained in the each assumed change scenario severity ranking calculation result data D6. In step S23, one assumed change scenarios is selected from among the each assumed change scenarios. In step S24, it is determined whether or not the voltage stability margin of the assumed change scenario which is selected in step S23 is less than a severity threshold (refer to FIG. 5) of the threshold data D8 which is read in step S5. Here, if the voltage stability margin of the selected assumed change scenario is less than the severity threshold, the selected assumed change scenario is selected as a severity scenario, and the processing proceeds to step S25. Meanwhile, if the voltage stability margin of the selected assumed change scenario is equal to or greater than the severity threshold, the processing returns to step S23 so as to select one of next assumed change scenarios. In step S25, severe scenario information is additionally stored in the each assumed change scenario severity ranking calculation result data D6. In step S26, it is determined whether or not the entire assumed change scenarios are selected. In a case where the entire assumed change scenarios are not selected, the processing returns to step S23, and in a case where the entire assumed change scenarios are selected, the processing ends.

Here, an example of the severe scenario severity ranking calculation will be described with reference to FIG. 16 and FIG. 17. FIG. 16 and FIG. 17 are examples illustrating images of the severe scenario severity ranking calculation unit 33. In FIG. 16, a horizontal axis denotes scenario No. and a vertical axis denotes a voltage stability margin. It can be seen that ranking can be performed by sorting each assumed change scenario in an ascending order according to a magnitude of the voltage stability margin obtained in step S5. In addition, in FIG. 17, a horizontal axis denotes scenario No. and a vertical axis denotes a voltage stability margin, in the same manner as in FIG. 16. However, a renewable energy change is considered for each assumed change scenario. It can be seen that ranking can be performed by sorting each assumed change scenario in an ascending order according to a magnitude of the voltage stability margin obtained in step S5. However, if ranking is performed by considering the renewable energy change in this way, in a case where it is hard to know a relationship between the respective assumed change scenarios, the ranking is performed without considering the renewable energy change as illustrated in FIG. 16. In addition, as only a great output change such as simultaneous dropping out of a wind farm is set as a target even in the renewable energy changes and ranking is performed by considering the renewable energy change, a significant assumed change scenario can be extracted by an operator. In addition, ranking of the assumed change scenario which is determined without the voltage stability margin in which the P-V curve or the V-Q curve is not written originally is performed by using other methods in step S6. The ranking is performed in line with an evaluation method or the like described in, for example, Su, Tanaka: "(N−1) Voltage Stability high-speed ranking method including voltage instability", Institute of Electrical Engineers of Theory B, Vol. 129, No. 9, pp. 1098-1106, 2009. By doing so, the assumed change scenario which is determined that there is no voltage stability margin is selected as a severe scenario, and furthermore, ranking is performed even among those.

Returning to FIG. 6, here, in step S7, vulnerable bus calculation is performed by using the severe scenario severity ranking calculation result D6 and the threshold data D8, and vulnerable bus calculation results are stored.

Here, a flow of the vulnerable bus calculation will be described with reference to FIG. 12 and FIG. 14. FIG. 12 and FIG. 14 are example of a flowchart illustrating processing of the vulnerable bus calculation unit 34. FIG. 12 is a flow which determines a vulnerable bus using the P-V curve of FIG. 13 through steps S31 to S38, the voltage stability calculation result data D4 and the threshold data D8 which are calculated in step S4 with respect to each severe scenario which is calculated in step S6 are read, one of the severe scenarios is selected, one of load buses is selected, it is determined whether or not $\Delta V_0$ of a P-V curve of the selected load bus is equal to or lower than a vulnerable bus threshold $\Delta V_0$, and in a case where $\Delta V_0$ of a P-V curve is not equal to or lower than the vulnerable bus threshold $\Delta V_0$, the load bus is selected again, in a case where $\Delta V_0$ of the P-V curve is equal to or lower than the vulnerable bus threshold $\Delta V_0$, it is determined whether or not $\Delta V/\Delta P$ in low solution of initial P of the P-V curve of the selected load bus is equal to or less than a vulnerable bus threshold $\Delta V/\Delta P$, and in a case where $\Delta V/\Delta P$ in the low solution of the initial P of the P-V curve of the selected load bus is not equal to or less than the vulnerable bus threshold $\Delta V/\Delta P$, the load bus is selected again, and in a case where $\Delta V/\Delta P$ in the low solution of the initial P of the P-V curve of the selected load bus is equal to or less than the vulnerable bus threshold $\Delta V/\Delta P$, it is determined to be a vulnerable bus and retained in the vulnerable bus calculation result data D7, and the load bus is selected again. In a case where the entire load buses are selected, the severe scenario is selected, a flow which obtains the vulnerable bus is repeated in the same flow, and in a case where the entire severe scenarios are selected, a bus having the largest $\Delta V_0$ in vulnerable bus candidates is determined as a vulnerable load bus to be retained, and the flow ends.

A flow of the aforementioned processing will be described hereinafter. In step S31, the voltage stability calculation result data D4 and the threshold data D8 which are calculated in step S4 with respect to each severe scenario that is calculated in step S6 are read, and are read into the memory 14. In step S32, it is determined whether or not the entire severe scenarios are selected, and in a case where the entire severe scenarios are not selected, the processing proceeds to step S33, and in a case where the entire severe scenarios are selected, the processing proceeds to step S39. In step S33, one of the severe scenarios is selected. In step S34, it is determined whether or not the entire load buses are selected, in a case where the entire load buses are not selected, the processing proceeds to step S35, and in a case where the entire load buses are selected, the processing returns to step S32. In step S35, one of the load buses is selected. In step S36, it is determined whether or not $\Delta V_0$ of the P-V curve of the selected load bus illustrated in FIG. 13 is equal to or lower than the vulnerable bus threshold $\Delta V_3$. Here, in a case where $\Delta V_0$ of the P-V curve is not equal to or lower than the vulnerable bus threshold $\Delta V$, the processing returns to step S36. In a case where $\Delta V_0$ of the P-V curve is equal to or lower than the vulnerable bus threshold $\Delta V_0$, the processing proceeds to step S37. In step S37, it is determined whether or not $\Delta V/\Delta P$ in the low solution of the initial P of the P-V curve of the selected load bus illustrated in FIG. 13 is equal to or less than the vulnerable bus threshold $\Delta V/\Delta P$. Here, in a case where $\Delta V/\Delta P$ in the low solution of the initial P of the P-V curve of the selected load bus is not equal to or less than the vulnerable bus threshold $\Delta V/\Delta P$, the processing returns to step S34. The load bus is selected again, and in a case where $\Delta V/\Delta P$ in the low solution of the initial P of the P-V curve of the selected load bus is equal to or less than the vulnerable bus threshold $\Delta V/\Delta P$, the processing proceeds to step S38. In step S38, the load bus which is selected in step S35 and is determined to be Yes in step S36 and step S37 is determined to be a vulnerable bus, and is retained in the vulnerable bus calculation result data D7. Thereafter, the processing returns to step S34. By the aforementioned flow, the entire severe scenarios and the entire load buses are selected, and a vulnerable bus group is determined. In addition, in step S39, a bus having the largest $\Delta V_0$ in vulnerable bus candidates is determined as the vulnerable load bus to be retained, and the flow ends.

Here, an example of the vulnerable bus calculation will be described with reference to FIG. 18. FIG. 18 is an example illustrating an image of the vulnerable bus calculation unit 34. FIG. 18 is an example in which a P-V curve that takes a horizontal axis denoting the total demand P of the active power and a vertical axis denoting the voltage $V_i$ of the node i is produced. A P-V curve of nodes 1 and 2 is showed, the respective operation points are $(P_0, V_{10})$ and $(P_0, V_{20})$, and low solutions $V_L$ which are a pair with each of high solution Vu are $(P_0, V'_{10})$ and $(P_0, V'_{20})$. Furthermore, the active power limit which is a limit of the voltage stability is the same location of $P_a$. A difference $\Delta V_{UL10}$ between the high solution $V_U = V_{10}$ and the low solution $V_L = V'_{10}$ of the node 1, and a difference $\Delta V_{UL20}$ between the high solution $V_U = V_{20}$ and the low solution $V_L = V'_{20}$ of the node 2 are values which are compared with the vulnerable bus threshold $\Delta V_0$ in step S36. Here, $\Delta V_{UL10}$ and $\Delta V_{UL20}$ are differences $\Delta V_{UL}$ between high solution and low solution of a voltage, and can be calculated by Expression (13).

$$\Delta V_{UL} = V_U - V_L \quad (13)$$

In addition, a slope of a tangent line $dV_{10}/dP_0$ in the low solution $V_L = V'_{10}$ of the node 1, and a slope of a tangent line $dV_{20}/dP_0$ in the low solution $V_L = V'_{20}$ of the node 2 are values which are compared with the vulnerable bus threshold $\Delta V/\Delta P$ in step S37. Since FIG. 18 is an image of the vulnerable bus calculation when the P-V curve takes the voltage $V_i$ of the node i with respect to the total demand P, a case of a P-V curve that takes the voltage $V_i$ of the node i with respect to demand increase of each node can also have a different idea. For example, it is considered that the case of a P-V curve which takes the voltage $V_i$ of the node i with respect to demand increase of each node has a different position of the active power limit with respect to the demand increase of each node. Hence, a load bus which has a small difference between an operation point and the active power limit and satisfies the flow of FIG. 12 can be selected as a vulnerable bus. FIG. 14 is a flow which determines the vulnerable bus using the V-Q curve of FIG. 15 through steps S31' to S38', the major part thereof is the same as that of the steps of FIG. 12, but the voltage stability calculation result data D4 and the threshold data D8 which are calculated in step S4 with respect to each severe scenario that is calculated in step S6 are read, one of the severe scenarios is selected, one of the load buses is selected, it is determined whether or not $\Delta Q$ of a V-Q curve of the selected load bus is equal to or less than the vulnerable bus threshold $\Delta Q$, and in a case where $\Delta Q$ of the V-Q curve is not equal to or less than the vulnerable bus threshold $\Delta Q$, the loads bus is selected again, and in a case where $\Delta Q$ of the V-Q curve is equal to or less than the vulnerable bus threshold $\Delta Q$, it is determined to be the vulnerable bus and is retained in the vulnerable bus calculation result data D7, and the load bus is selected again. In a case where the entire load buses are selected, a severe scenario is selected, a flow which obtains a vulnerable bus is repeated in the same flow, and in a case where the entire severe scenarios are selected, a bus having the smallest $\Delta Q$ in vulnerable bus candidates is determined as a vulnerable load bus to be retained, and the flow ends.

A flow of the aforementioned processing will be described hereinafter. Processing of steps S31 to S35 is the same as the processing of FIG. 12, and in step S31, the voltage stability calculation result data D4 and the threshold data D8 which are calculated in step S4 with respect to each severe scenario that is calculated in step S6 are read, and are read into the memory 14. In step S32, it is determined whether or not the entire severe scenarios are selected, and in a case where the entire severe scenarios are not selected, the processing proceeds to step S33, and in a case where the entire severe scenarios are selected, the processing proceeds to step S39'. In step S33, one of the severe scenarios is selected. In step S34, it is determined whether or not the entire load buses are selected, in a case where the entire load buses are not selected, the processing proceeds to step S35, and in a case where the entire load buses are selected, the processing returns to step S32. In step S35, one of the load buses is selected. In step S36', it is determined whether or not $\Delta Q$ of the V-Q curve of the selected load bus illustrated in FIG. 15 is equal to or less than the vulnerable bus threshold $\Delta Q$. Here, in a case where $\Delta Q$ of the V-Q curve is not equal to or less than the vulnerable bus threshold $\Delta Q$, the processing returns to step S34. In a case where $\Delta Q$ of the V-Q curve is equal to or less than the vulnerable bus threshold $\Delta Q$, the processing proceeds to step S38. In step S38, the load bus which is selected in step S35 and is determined to be Yes in step S36', is determined to be a vulnerable bus, and is retained in the vulnerable bus calculation result data D7. Thereafter, the processing returns to step S34. By the aforementioned flow, the entire severe scenarios and the entire load buses are selected, and a vulnerable bus group is determined. In addition, in step S39', a bus having the smallest $\Delta Q$ in vulnerable bus candidates is determined as the vulnerable load bus to be retained, and the flow ends.

Here, an example of the vulnerable bus calculation will be described with reference to FIG. 19. FIG. 19 is an example illustrating an image of the vulnerable bus calculation unit 34. FIG. 18 is an example in which a V-Q curve that takes a horizontal axis denoting the voltage $V_i$ of the node i and a vertical axis denoting the total demand P of the active power is produced. A V-Q curve of nodes 1 and 2 is showed, the respective operation points are $(V_{10}, Q_{10})$ and $(V_{20}, Q_{20})$. Furthermore, the reactive power limit $Q_C$ which is a limit of the voltage stability is the locations of $Q_{1C}$ and $Q_{2C}$. $\Delta Q_1$ and $\Delta Q_2$ which are differences between reactive power Q=0 of the nodes 1 and 2 and reactive power limit $Q_C$ are values which are compared with the vulnerable bus threshold $\Delta Q$ in step S36'. A voltage lower than the reactive power limit in the V-Q curve is instable. For example, a voltage equal to or lower than $V_{1C}$ in node 1 is instable, and a voltage equal to or lower than $V_{2C}$ in node 2 is instable. Since FIG. 19 is an image of the vulnerable bus calculation when the V-Q curve takes the voltage $V_i$ of the node i with respect to a total reactive power amount Q, a case of the V-Q curve that takes the voltage $V_i$ of the node i with respect to an reactive power increase of each node can also have a different idea. For example, it is considered that the case of a V-Q curve which takes the voltage $V_i$ of the node i with respect to reactive power increase of each node has a different position of the reactive power limit with respect to the reactive power increase of each node. Hence, a load bus which has a small difference between an operation point and the reactive power limit and satisfies the flow of FIG. 14 can be selected as a vulnerable bus. Determination methods or evaluation methods of the vulnerable bus of FIG. 12, FIG. 14, FIG. 18, and FIG. 19 show examples, and other methods are performed in line with a determination method, an evaluation method, or the like described in, for example, WECC, "Voltage Stability Criteria, Undervoltage Load Shedding Strategy, and Reactive Power Reserve Monitoring Methodology", Final Report, 1998, pp. 33-58, or Power System Stable Operation Technical Committee: "Power System Stabile Operation Technique", Electric Cooperative Research, Vol. 47, No. 1, 1991, pp. 24-34. The vulnerable bus can also be termed a limit bus, and is a bus which causes a limit of voltage stability. Since a voltage of the vulnerable bus decreases, a system voltage and reactive power is insufficiently supplied, and thereby, voltage breakdown occurs. The vulnerable bus is not limited to one bus with respect to one severe scenario, and the vulnerable bus can also move by approaching an actual system by considering restriction with regard to a voltage and reactive power such as power factor restriction of a power generator which will be described in Embodiment 2. In addition, the P-V curve or the V-Q curve is not written originally in step S4, determination is made without a voltage stability margin in step S5, ranking is performed and the scenario is selected as the severe scenario by using the identification method in step S6, and furthermore, since the P-V curve or the V-Q curve is not written originally, a bus in which ranking is performed among those is not able to use the vulnerable bus calculation. Hence, the vulnerable bus is unknown, but by displaying alarm which is termed a severe scenario, it is considered that after notifying the severe scenario, processing for writing the P-V curve or the V-Q curve, for example, reducing a load of a system, or the like is performed, the vulnerable bus calculation is used. In this case, the processing for writing the P-V curve or the V-Q curve is performed at the same time as the severe scenario in which the P-V curve or the V-Q curve is not written originally, and thus, comparison between those can be performed.

Here, an example of vulnerable bus calculation results will be described with reference to FIG. 20. FIG. 20 is an example illustrating an image of the vulnerable bus calculation unit 34. As illustrated in FIG. 20, there is an advantage in which, by displaying a position of a vulnerable bus on a system diagram, an operator easily find out a vulnerable bus with respect to voltage stability and easily review countermeasures. Furthermore, there is also an advantage in which an instable bus can be easily grasped by displaying overlapped vulnerable buses of a plurality of severe scenarios. In addition, by displaying the bus without an external system, it is possible to improve visibility with regard to voltage stability of a target system.

Returning to FIG. 6, here, in step S8, a monitoring location change is performed at a location where there are a vulnerable bus or lots of vulnerable buses, using the vulnerable bus calculation result D7. Accordingly, there is an effect in which deterioration of voltage stability that a driver does not think can be predicted. The monitoring location may display a plurality of locations, and may display a most vulnerable bus. Data which is accumulated in a memory as a result of various calculations or during calculation may be sequentially displayed on a screen of the monitoring control device 210. Thereby, an operator can easily grasp an operation situation of the voltage stability monitoring device 10. In addition, monitoring content (occurrence of vulnerable bus) or the like may be displayed as a drive situation in the voltage stability monitoring device 10. Thereby, the operator can easily grasp the operation situation of the voltage stability monitoring device 10. Display of the situation occurring until various types of data are received and various types of calculation results are respectively transmitted, on a screen is repeated until the monitoring location change is performed.

Thereafter, the processing may return to a data receiving step in step S2, and input data may be modified after returning to data input processing in step S1.

Here, FIG. 21 is referred to. FIG. 21 is a diagram illustrating an example of a screen which displays the voltage stability calculation results and the voltage stability margin calculation results as a voltage stability monitoring situation. As illustrated in FIG. 21, the severe scenario and a current monitoring situation of the voltage stability are displayed in the voltage stability monitoring device 10 or on a screen of the monitoring control device 210 through the communication network 300, and thus, there is an effect in which the voltage stability of the power system 100 can be seen at a glance. In addition, if a designated location is moved, a voltage value of each scenario and the voltage stability margin are displayed, and thus, a function by which a user can easily view data is also provided. In addition, by displaying a voltage margin, an operator can grasp a margin at a glance. In addition, some of indexes of the voltage stability can be selected, and the respective results and a function by which display on the screen can be operated are also provided. Thereby, inclemency of the voltage stability can be easily evaluated. In addition, a function of selecting past history and changing the display is provided. Thereby, normally, the vulnerable bus of each scenario is display, and it is also possible to confirm the P-V curves of other nodes.

Here, FIG. 22 is referred to. FIG. 22 is a diagram illustrating an example of a screen which displays each scenario severity ranking results and vulnerable bus system information. As illustrated in FIG. 22, each scenario severity ranking results which are calculation results and vulnerable bus system information are displayed in the voltage stability monitoring device 10 or on a screen of the monitoring control device 210 through the communication network 300, and thus, there is an effect in which a situation of the sever scenario where the voltage stability of the power system 100 is deteriorated is viewed at a glance. In addition, if a designated location is moved, a voltage stability margin of each scenario is displayed and a curve with regard to the voltage stability is displayed on another screen, and thus, a function by which a user can easily view data is also provided. In addition, by displaying a severity threshold and displaying a severe scenario or a severe scenario number, an operator can grasp a severe scenario at a glance. In addition, by setting a condition determining whether or not renewable energy is considered, and updating each scenario severity ranking results and vulnerable bus system information, a function of grasping easily calculation results of various types of conditions is provided. Furthermore, a function is provided by which each assumed change scenario is selected, a location of a vulnerable bus is displayed on a screen at that time, and content can be seen. Thereby, it is possible to easily recognize positions of one or a plurality of vulnerable buses. In addition, a function of selecting past history and being capable of changing display is provided. Thereby, normally, a current vulnerable bus of severe scenario is display, and it is also possible to confirm vulnerable buses of other assumed change scenarios. In addition, a function of being capable of display a P-V curve or a V-Q curve of the same bus, by clicking the vulnerable bus is provided. Thereby, there is an advantage in which a situation where voltage stability of a vulnerable bus is evaluated can be easily confirmed.

Embodiment 2

The present embodiment describes an example of the voltage stability monitoring device in which it is determined whether a vulnerable bus is an accurate vulnerable bus based on restriction data D10 and is not a vulnerable bus obtained by simply performing vulnerable bus calculation, voltage stability calculation to which the restriction data is added is performed, and thus, an accurate vulnerable bus calculation is performed, in the vulnerable bus calculation of Embodiment 1. Descriptions on content which overlaps the content described in FIG. 1 to FIG. 22 will be omitted.

FIG. 23 is an example of an entire configuration diagram of the voltage stability monitoring device 10 according to Embodiment 2, and is configured by a device in which the restriction data D10 is added to the example of the entire configuration diagram of the voltage stability monitoring device 10 according to Embodiment 1 illustrated in FIG. 1. In the voltage stability monitoring device 10 in FIG. 23, description on the configuration to which the same symbols or reference numerals as those illustrated in FIG. 1 previously described are attached, and portions having the same function will be omitted. Input data of the voltage stability monitoring device 10 is configured with the system data D1, the system facility data D2, the assumed change scenario data D3, the threshold data D8, and the restriction data D10.

Here, FIG. 24 illustrated an example of the restriction data D10. The restriction data D10 is, for example, active power restriction, reactive power restriction, power factor restriction, or the like of each bus (restriction on a power generator is previously described in step S4). Here, an example of a flowchart illustrating entire processing of the voltage stability monitoring device having a flow of vulnerable bus calculation including the restriction data by considering the restriction data D10 is illustrated in FIG. 25.

Subsequently, calculation processing content of the voltage stability monitoring device 10 will be described with reference to FIG. 25. FIG. 25 is configured by FIG. 6 in which the restriction data D10 is included, and thus, description on the same step portions as in FIG. 6 will be omitted. Step S1 and step S41, step S2 and step S42, step S3 and step S43, step S4 and step S44, step S5 and step S45, step S6 and step S46, step S7 and step S47, and step S8 and step S51 respectively have the same content.

In step S48, it is confirmed whether or not the entire vulnerable buses calculated in step S47 satisfy the restriction data D10. In a case where the buses do not satisfy the restriction data D10, the processing proceeds to step S49, and in a case where the buses satisfy the restriction data D10, the processing proceeds to step S51.

In step S49, a most vulnerable bus which is a bus that is selected in step S47 and is the most vulnerable is selected, and the processing proceeds to step S50.

In step S50, the most vulnerable bus selected in step S49 is restricted, data is rewritten, and the processing returns to calculation of step S44. Thereby, there is an effect in which voltage stability of a power system closer to reality can be reviewed. By providing a difference between Embodiment 1 and Embodiment 2 to an operator, it can help people to think the reason why the vulnerable bus is calculated.

Embodiment 3

The present embodiment described an example of the voltage stability monitoring device which can transmit not only the voltage stability monitoring of Embodiment 1 but also the voltage stability monitoring result data D41 to an external monitoring control device. Description on content which overlaps the content described in FIG. 1 to FIG. 22 will be omitted.

FIG. 26 is an example of an entire configuration diagram of a voltage stability monitoring device, to which threshold data, a data transmission unit, and a monitoring control device are added with respect to FIG. 1 of Embodiment 1, according to Embodiment 3. In the voltage stability monitoring device 10 of FIG. 26, description on the configuration to which the same symbols or reference numerals as those illustrated in FIG. 1 previously described are attached, and portions having the same function will be omitted. A function of transmitting the voltage stability monitoring calculation result data D41 which is calculated by the voltage stability monitoring device 10 to the monitoring control device 210, a central power supplying command office, or an EMS through the communication network 300, using a data communication unit 37 is provided. Thereby, there is an advantage in which the monitoring control device 210, the central power supplying command office, or the EMS easily makes a control plan for voltage stability maintenance, based on information on the voltage stability.

REFERENCE SIGNS LIST

10: VOLTAGE STABILITY MONITORING DEVICE
11: DISPLAY UNIT
12: INPUT UNIT
13: COMMUNICATION UNIT
14: CPU
15: MEMORY
20: RESTRICTION DATA
21: SYSTEM MEASUREMENT DATA (SYSTEM MEASUREMENT DATABASE)
22: SYSTEM FACILITY DATA (SYSTEM FACILITY DATABASE)
23: ASSUMED CHANGE SCENARIO DATA (ASSUMED CHANGE SCENARIO DATABASE)
24: VOLTAGE STABILITY CALCULATION RESULT DATA (VOLTAGE STABILITY CALCULATION RESULT DATABASE)

25: VOLTAGE STABILITY MARGIN CALCULATION RESULT DATA (VOLTAGE STABILITY MARGIN CALCULATION RESULT DATABASE)
26: EACH SCENARIO SEVERITY RANKING CALCULATION RESULT DATA (EACH SCENARIO SEVERITY RANKING CALCULATION RESULT DATABASE)
27: VULNERABLE BUS CALCULATION RESULT DATA (VULNERABLE BUS CALCULATION RESULT DATABASE)
28: THRESHOLD DATA (THRESHOLD DATABASE)
29: PROGRAM DATA (PROGRAM DATABASE)
30: ASSUMED CHANGE SCENARIO CALCULATION UNIT
31: VOLTAGE STABILITY CALCULATION UNIT
32: VOLTAGE STABILITY MARGIN CALCULATION UNIT
33: EACH SCENARIO SEVERITY RANKING CALCULATION UNIT
34: VULNERABLE BUS CALCULATION UNIT
35: MONITORING LOCATION CHANGE UNIT
36: MONITORING LOCATION DISPLAY UNIT
37: DATA COMMUNICATION UNIT
40: VOLTAGE STABILITY MONITORING CALCULATION UNIT
41: VOLTAGE STABILITY MONITORING CALCULATION RESULT DATA (VOLTAGE STABILITY MONITORING CALCULATION RESULT DATABASE)
43: BUS LINE
44: MEASUREMENT DEVICE
51: SYSTEM MEASUREMENT DATA
59: MONITORING LOCATION CHANGE COMMAND DATA
100: POWER SYSTEM
110: POWER SUPPLY
120a, 120b, 121a, 121b: NODE (BUS)
130a, 130b: TRANSFORMER
140a, 140b, 141a, 141b: BRANCH (LINE PATH)
150: LOAD
210: MONITORING CONTROL DEVICE
300: COMMUNICATION NETWORK
310: VOLTAGE STABILITY MONITORING SCREEN
320: VOLTAGE STABILITY CALCULATION RESULT SCREEN AND VOLTAGE STABILITY MARGIN CALCULATION RESULT SCREEN
330: EACH SCENARIO SEVERITY RANKING SCREEN
340: VULNERABLE BUS SYSTEM INFORMATION SCREEN
541: VOLTAGE STABILITY MONITORING RESULT DATA

The invention claimed is:

1. A voltage stability monitoring device which monitors voltage stability of a power system comprising:
a processor;
a memory storing a program which, when executed, causes the processor to:
produce a plurality of assumed change scenarios indicating a scenario of a change that is assumed based on at least one of a system configuration of the power system and a change of a tide state;
calculate the voltage stability using the assumed change scenario;
calculate a voltage stability margin indicating margin degree of the voltage stability, based on the voltage stability;
select an assumed change scenario with high severity of the voltage stability for each assumed change scenario, based on the voltage stability margin;
calculate which of buses in the power system is a vulnerable bus that decreases voltage stability, based on the assumed change scenario which is selected; and
change a monitoring target of the voltage stability, based on information of the vulnerable bus.

2. The voltage stability monitoring device according to claim 1, wherein the assumed change scenario includes at least one of a failure location, a failure aspect, an assumed renewable energy change amount, and failure removal timing, as a failure case which is assumed in the power system, and includes at least one of solar power generation, wind power generation, an output change amount of mega solar or wind farm, and simultaneous drooping out of wind farm, as the assumed renewable energy change amount.

3. The voltage stability monitoring device according to claim 1, wherein the processor calculates a change of a node voltage with respect to total demand of power system or demand of each node, and calculates at least one of a P-V curve and V-Q curve.

4. The voltage stability monitoring device according to claim 1, wherein the P-V curve uses repetition of ti de calculation or continuation type tide calculation.

5. The voltage stability monitoring device according to claim 4, wherein control of a step width of predictor calculation in the continuation type tide calculation determines the step width by using a binary search method or a method of increasing or decreasing the step width using at least one of the number of times of convergence calculation of modifier calculation.

6. The voltage stability monitoring device according to claim 4, wherein, in a case where calculation of low solution of a voltage in the continuation type tide calculation is not completed, control of a step width of predictor calculation is recalculated until calculation of the low solution of a voltage is completed, by changing an integer which is an index that increases and decreases a step width according to the number of times of convergence calculation of modifier calculation.

7. The voltage stability monitoring device according to claim 1, wherein the unit processor calculates at least one of an active power deviation or a voltage deviation between an operation point and limit power, and a reactive power deviation between a point of zero and limit power of reactive power, using a P-V curve or a V-Q curve which is calculated by the voltage stability calculation unit.

8. The voltage stability monitoring device according to claim 1, wherein the processor determines sequence by sorting the assumed change scenarios in an ascending order of the voltage stability.

9. The voltage stability monitoring device according to claim 1, further comprising:
a database with a threshold of the severity for selecting the assumed change scenario.

10. The voltage stability monitoring device according to claim 1, further comprising:
a database with a threshold for selecting the vulnerable bus.

11. The voltage stability monitoring device according to claim 1, wherein the processor determines the vulnerable bus, using a P-V curve, at least one of a voltage deviation between high solution and low solution of an operation point and a voltage change rate with respect to active power of the low solution, and the threshold.

12. The voltage stability monitoring device according to claim 1, wherein the processor determines the vulnerable bus using a V-Q curve, a reactive power deviation between a point of zero and limit power of reactive power, and the threshold.

13. The voltage stability monitoring device according to claim 1, wherein the processor determines a vulnerable bus which is the most vulnerable in the vulnerable buses, using at least one of voltage deviations between high solution and low solution of an operation point, a voltage change rate with respect to active power of the low solution, and reactive power deviation between a point of zero and limit power of reactive power, and displays the determined vulnerable bus on a screen of a display unit.

14. The voltage stability monitoring device according to claim 1, further comprising:
    a restriction database which is used for the vulnerable bus calculation, and includes at least one piece of restriction data of active power restriction, reactive power restriction, and power factor restriction of each node.

15. A voltage stability monitoring method of monitoring voltage stability of a power system with a voltage stability monitoring device that includes a processor and a memory storing a program which, when executed, causes the processor to execute the method comprising:
    producing a plurality of assumed change scenarios indicating a scenario of a change that is assumed based on at least one of a system configuration of the power system and a change of a tide state;
    calculating the voltage stability using the assumed change scenario;
    calculating a voltage stability margin indicating margin degree of the voltage stability, based on the voltage stability;
    selecting an assumed change scenario with high severity of the voltage stability for each assumed change scenario, based on the voltage stability margin;
    calculating which of buses in the power system is a vulnerable bus that decreases voltage stability, based on the assumed change scenario which is selected; and
    changing a monitoring target of the voltage stability, based on information of the vulnerable bus.

* * * * *